(12) United States Patent
Yeon et al.

(10) Patent No.: US 11,675,438 B2
(45) Date of Patent: Jun. 13, 2023

(54) DISPLAY DEVICE AND SOUND PROVIDING METHOD OF THE DISPLAY DEVICE

(71) Applicant: SAMSUNG DISPLAY CO., LTD., Yongin-si (KR)

(72) Inventors: Eun Kyung Yeon, Suwon-si (KR); Ga Na Kim, Icheon-si (KR); Jung Hun Noh, Yongin-si (KR); Yi Joon Ahn, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 2 days.

(21) Appl. No.: 16/704,812

(22) Filed: Dec. 5, 2019

(65) Prior Publication Data

US 2020/0278750 A1 Sep. 3, 2020

(30) Foreign Application Priority Data

Feb. 28, 2019 (KR) .................. 10-2019-0024349
Jun. 7, 2019 (KR) .................. 10-2019-0067234

(51) Int. Cl.
| | | |
|---|---|---|
| G06F 3/041 | (2006.01) | |
| G06F 3/01 | (2006.01) | |
| B06B 1/04 | (2006.01) | |
| H01L 27/32 | (2006.01) | |
| B06B 1/06 | (2006.01) | |

(52) U.S. Cl.
CPC .............. *G06F 3/016* (2013.01); *B06B 1/045* (2013.01); *B06B 1/0688* (2013.01); *H01L 27/3225* (2013.01); *H01L 27/3244* (2013.01)

(58) Field of Classification Search
CPC ....... B06B 1/045; B06B 1/0688; G06F 3/016; H01L 27/3225; H01L 27/3244
See application file for complete search history.

(56) References Cited

U.S. PATENT DOCUMENTS

| | | | | |
|---|---|---|---|---|
| 8,059,105 | B2 | 11/2011 | Rosenberg et al. | |
| 2006/0181522 | A1* | 8/2006 | Nishimura | G06F 3/016 345/177 |
| 2007/0080951 | A1* | 4/2007 | Maruyama | G06F 3/016 345/173 |
| 2008/0084384 | A1* | 4/2008 | Gregorio | G06F 3/016 345/156 |
| 2009/0096326 | A1* | 4/2009 | Onishi | H04R 17/00 310/334 |
| 2013/0335210 | A1* | 12/2013 | Arai | G06F 1/1643 340/407.2 |

(Continued)

FOREIGN PATENT DOCUMENTS

| | | |
|---|---|---|
| KR | 1020120116177 | 10/2012 |
| KR | 1020180078121 | 7/2018 |

(Continued)

*Primary Examiner* — Temesghen Ghebretinsae
*Assistant Examiner* — Sosina Abebe
(74) *Attorney, Agent, or Firm* — F. Chau & Associates, LLC

(57) ABSTRACT

A display device includes a display panel, a bracket disposed on a first surface of the display panel, and a first vibrating device disposed between the first surface of the display panel and a first surface of the bracket which faces the first surface of the display panel. The first vibrating device is configured to output a first sound and provide a haptic feedback by vibrating the display panel and the bracket.

27 Claims, 28 Drawing Sheets

(56) References Cited

U.S. PATENT DOCUMENTS

| | | | | |
|---|---|---|---|---|
| 2015/0014644 | A1* | 1/2015 | Namkung | H01L 51/56 |
| | | | | 257/40 |
| 2015/0084902 | A1* | 3/2015 | Atsumi | G06F 1/1626 |
| | | | | 345/173 |
| 2015/0138157 | A1* | 5/2015 | Harris | H04R 3/02 |
| | | | | 345/175 |
| 2015/0256656 | A1* | 9/2015 | Horii | H04M 1/0202 |
| | | | | 455/575.1 |
| 2015/0350775 | A1* | 12/2015 | Behles | H04R 3/002 |
| | | | | 381/354 |
| 2017/0105294 | A1* | 4/2017 | Shimoda | H05K 5/0017 |
| 2017/0257707 | A1* | 9/2017 | Shimoda | H04R 7/04 |
| 2017/0280216 | A1* | 9/2017 | Lee | H04R 3/14 |
| 2019/0018448 | A1* | 1/2019 | Lee | G06F 1/1605 |
| 2019/0261092 | A1* | 8/2019 | Landick | G06F 1/1626 |
| 2020/0059713 | A1 | 2/2020 | Noh et al. | |
| 2020/0076367 | A1* | 3/2020 | Matsuzawa | B06B 1/0648 |
| 2020/0077169 | A1 | 3/2020 | Noh et al. | |
| 2020/0207282 | A1* | 7/2020 | Mizugaki | G06F 3/016 |
| 2020/0233629 | A1 | 7/2020 | Yeon et al. | |
| 2020/0264705 | A1* | 8/2020 | Taninaka | G06F 3/0436 |

FOREIGN PATENT DOCUMENTS

| | | |
|---|---|---|
| KR | 1020200019811 | 2/2020 |
| KR | 1020200028056 | 3/2020 |
| KR | 10-2020-0091533 | 7/2020 |

* cited by examiner

DISPLAY DEVICE AND SOUND PROVIDING METHOD OF THE DISPLAY DEVICE

CROSS-REFERENCE TO RELATED APPLICATIONS

This application claims priority under 35 U.S.C § 119 to Korean Patent Application No. 10-2019-0024349 filed on Feb. 28, 2019, and Korean Patent Application No. 10-2019-0067234 filed on Jun. 7, 2019 the disclosures of which are incorporated by reference herein in their entireties.

TECHNICAL FIELD

Exemplary embodiments of the present inventive concept relate to a display device, and more particularly, a display device capable of outputting sound and haptic feedback.

DISCUSSION OF THE RELATED ART

As technology advances, the demand for various forms of display devices for displaying images is increasing. For example, display devices are being utilized with various electronic devices such as, for example, smartphones, digital cameras, notebook computers, navigation devices, and smart televisions. A display device may include a display panel for displaying an image, a vibrating device for providing sound, and another vibrating device for providing a haptic interface to a user.

SUMMARY

Aspects of the present disclosure provide a display device capable of providing both sound and a haptic interface by using one vibrating device.

According to an exemplary embodiment, a display device includes a display panel, a bracket disposed on a first surface of the display panel, and a first vibrating device disposed between the first surface of the display panel and a first surface of the bracket which faces the first surface of the display panel. The first vibrating device is configured to output a first sound and provide a haptic feedback by vibrating the display panel and the bracket.

In an exemplary embodiment, a first surface of the first vibrating device is attached to the first surface of the display panel, and a second surface of the first vibrating device is attached to the first surface of the bracket.

In an exemplary embodiment, the display device further includes a first adhesive disposed between the display panel and the first vibrating device and attaching the first vibrating device to the display panel, and a second adhesive disposed between the bracket and the first vibrating device and attaching the first vibrating device to the bracket.

In an exemplary embodiment, the bracket includes a first groove disposed in the first surface of the bracket and overlapping the first vibrating device.

In an exemplary embodiment, a first surface of the first vibrating device is attached to the first surface of the display panel, and a second surface of the first vibrating device is attached to a bottom surface of the first groove.

In an exemplary embodiment, the display device further includes a first adhesive disposed between the display panel and the first vibrating device and attaching the first vibrating device to the display panel, and a second adhesive disposed between the bottom surface of the first groove and the first vibrating device and attaching the first vibrating device to the bottom surface of the first groove.

In an exemplary embodiment, the bracket includes a first hole overlapping the first vibrating device.

In an exemplary embodiment, the display device further includes a support member disposed on a surface of the first vibrating device and supporting the first vibrating device.

In an exemplary embodiment, the support member overlaps the first hole.

In an exemplary embodiment, the display device further includes a fastener attaching the support member to a second surface of the bracket, which is opposite the first surface of the bracket.

In an exemplary embodiment, at least a portion of the support member is disposed opposite to at least one side surface of the first vibrating device.

In an exemplary embodiment, the display device further includes a fastener attaching the support member to a sidewall of the first hole of the bracket.

In an exemplary embodiment, the support member is disposed on the first surface of the bracket.

In an exemplary embodiment, the display device further includes a fastener attaching the support member to the first surface of the bracket.

According to an exemplary embodiment, a display device includes a display panel, a bracket disposed on a first surface of the display panel, a first vibrating device disposed between the first surface of the display panel and a first surface of the bracket which faces the first surface of the display panel, and a second vibrating device disposed on the first surface of the display panel. The first vibrating device is configured to output a first sound and provide a haptic feedback by vibrating the display panel and the bracket, and the second vibrating device is configured to output a second sound by vibrating the display panel.

In an exemplary embodiment, a first surface of the first vibrating device is attached to the first surface of the display panel, and a second surface of the first vibrating device is attached to the first surface of the bracket.

In an exemplary embodiment, the display device further includes a first adhesive disposed between the display panel and the first vibrating device and attaching the first vibrating device to the display panel, and a second adhesive disposed between the bracket and the first vibrating device and attaching the first vibrating device to the bracket.

In an exemplary embodiment, the display device further includes a gap disposed between the second vibrating device and the bracket.

In an exemplary embodiment, the display device further includes an adhesive disposed between the display panel and the second vibrating device.

In an exemplary embodiment, the bracket includes a first groove disposed in the first surface of the bracket and overlapping the first vibrating device, and a second groove overlapping the second vibrating device.

In an exemplary embodiment, the display device further includes a gap disposed between a second surface of the second vibrating device and a bottom surface of the second groove. A first surface of the first vibrating device is attached to the first surface of the display panel and a second surface of the first vibrating device is attached to a bottom surface of the first groove, and a first surface of the second vibrating device is attached to the first surface of the display panel.

In an exemplary embodiment, the bracket includes a first groove disposed in the first surface of the bracket and overlapping the first vibrating device, and a second hole overlapping the second vibrating device.

In an exemplary embodiment, the display device further includes a battery disposed on a second surface of the bracket, which is opposite the first surface of the bracket. The second hole overlaps the battery.

In an exemplary embodiment, the bracket includes a first hole in which the first vibrating device is disposed, and a second hole in which the second vibrating device is disposed.

In an exemplary embodiment, the display device further includes a support member disposed on a surface of the first vibrating device and supporting the first vibrating device.

In an exemplary embodiment, the support member overlaps the first hole.

In an exemplary embodiment, the first vibrating device is a linear resonant actuator (LRA) which vibrates the display panel and the bracket by generating a magnetic force using a voice coil according to a first applied voltage, and the second vibrating device is a piezoelectric element which vibrates the display panel using a piezoelectric material that contracts or expands according to a second applied voltage.

In an exemplary embodiment, the first vibrating device includes a voice coil having a first end to which a first driving voltage is applied and a second end to which a second driving voltage is applied, a magnet having a first surface in which a voice coil groove for accommodating the voice coil is disposed, an elastic body disposed on a second surface of the magnet which is opposite the first surface of the magnet, and a chassis disposed on the elastic body.

In an exemplary embodiment, the second vibrating device includes a first electrode to which a first driving voltage is applied, a second electrode to which a second driving voltage is applied, and a vibration layer disposed between the first electrode and the second electrode and having a piezoelectric material which contracts or expands according to the first driving voltage applied to the first electrode and the second driving voltage applied to the second electrode.

According to the aforementioned and other exemplary embodiments of the present inventive concept, a display device includes a first vibrating device which is attached to both a display panel and a bracket and vibrates the display panel and the bracket. Therefore, exemplary embodiments may output a first sound by vibrating the display panel using the first vibrating device and provide haptic feedback by vibrating the bracket using the first vibrating device. That is, both sound and a haptic interface may be provided by using one vibrating device according to exemplary embodiments.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
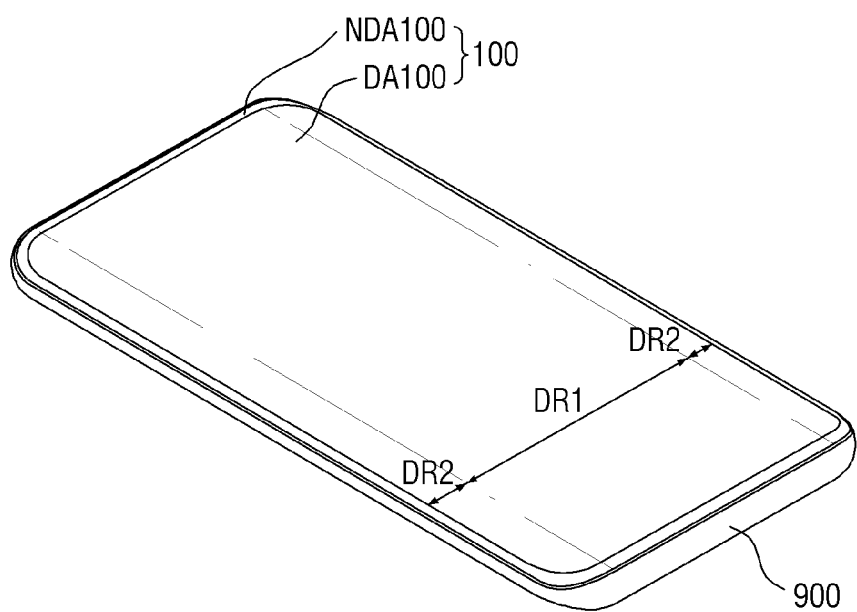
FIG. 1 is a perspective view of display device according to an exemplary embodiment.
Figure 1:
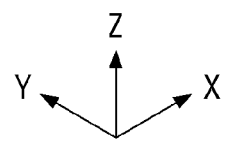

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

It will be further understood that the terms "first," "second," "third," etc. are us ed herein to distinguish one element from another, and the elements are not limited by these terms. Thus, a "first" element in an exemplary embodiment may be described as a "second" element in another exemplary embodiment.

It will be further understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include t he plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Figure 2:
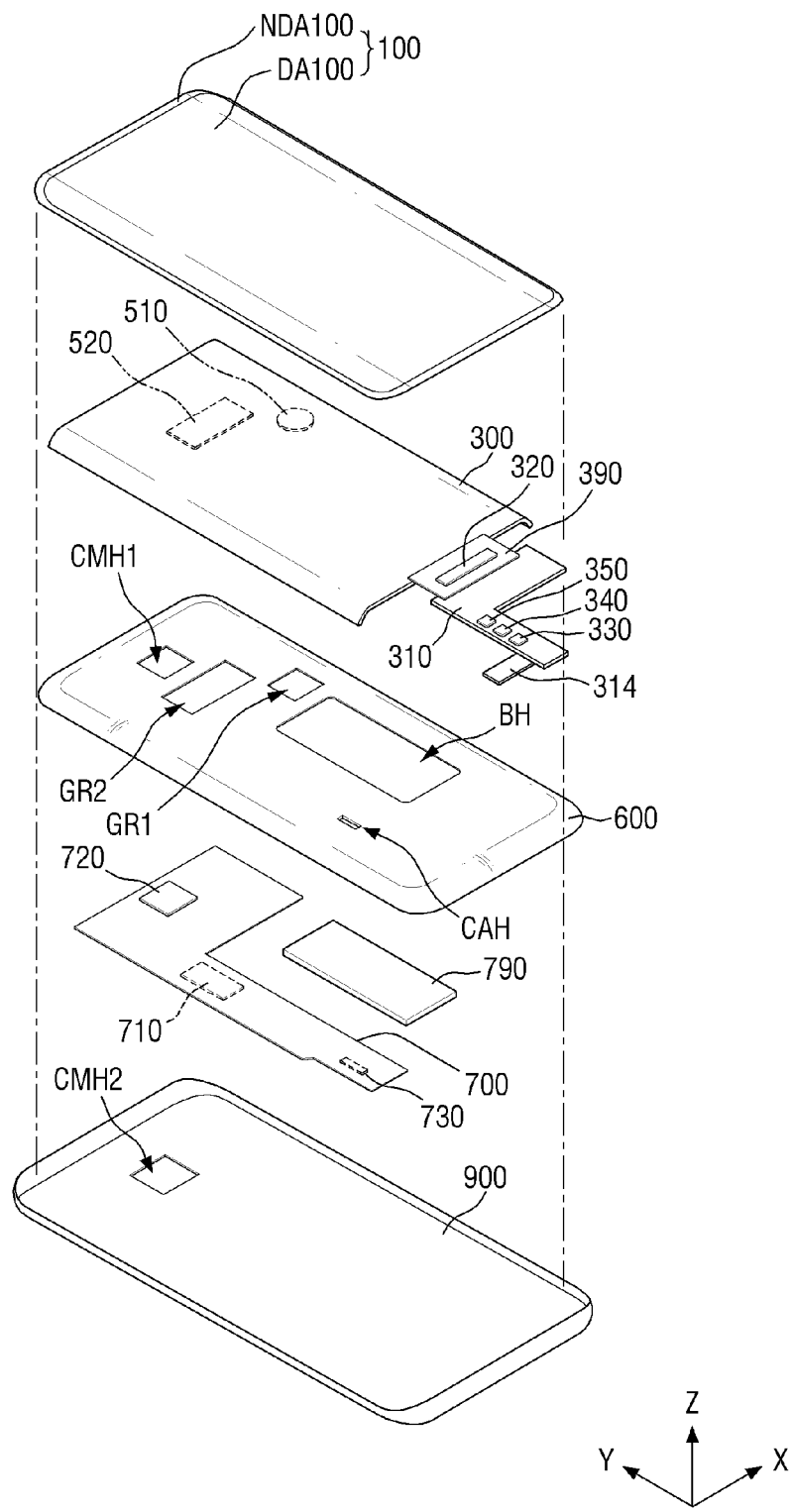
FIG. 2 is an exploded perspective view of the display device of FIG. 1.

FIG. 1 is a perspective view of a display device 10 according to an exemplary embodiment. FIG. 2 is an exploded perspective view of the display device 10 of FIG. 1.

Referring to FIGS. 1 and 2, the display device 10 according to an exemplary embodiment includes a cover window 100, a display panel 300, a display circuit board 310, a display driver circuit 320, a flexible film 390, a vibrating device 510, a bracket 600, a main circuit board 700, and a lower cover 900.

In the present specification, the term "above" indicates a direction in which the cover window 100 is disposed with respect to the display panel 300, that is, a Z-axis direction, and the term "below" indicates a direction in which the bracket 600 is disposed with respect to the display panel 300, that is, a direction opposite to the Z-axis direction. In addition, "left," "right," "upper" and "lower" indicate directions when the display panel 300 is seen in a plan view. For example, "left" indicates a direction opposite to an X-axis direction, "right" indicates the X-axis direction, "upper" indicates a Y-axis direction, and "lower" indicates a direction opposite to the Y-axis direction.

The display device 10 may be rectangular in a plan view. For example, the display device 10 may have a rectangular planar shape having short sides in a first direction (X-axis direction) and long sides in a second direction (Y-axis direction), as illustrated in FIGS. 1 and 2. Each corner at which a short side extending in the first direction (X-axis direction) meets a long side extending in the second direction (Y-axis direction) may be rounded with a predetermined curvature or may be right-angled. The planar shape of the display device 10 is not limited to the rectangular shape. For example, in exemplary embodiments, the planar shape of the display device 10 may be another polygonal shape, a circular shape, or an elliptical shape.

The display device 10 may include a first area DR1, which is formed to be substantially flat, and a second area DR2 extending from right and left sides of the first area DR1. The second area DR2 may be formed to be substantially flat or curved. When the second area DR2 is formed to be substantially flat, an angle formed by the first area DR1 and the second area DR2 may be an obtuse angle. When the second area DR2 is formed to be curved, the second area DR2 may have a constant curvature or a varying curvature.

In FIG. 1, the second area DR2 extends from each of the right and left sides of the first area DR1. However, exemplary embodiments are not limited thereto. For example, in an exemplary embodiment, the second area DR2 may extend from only one of the right and left sides of the first area DR1. Alternatively, in an exemplary embodiment, the second area DR2 may extend not only from the right and left sides of the first area DR1, but also from at least any one of the upper and lower sides of the first area DR1. A case in which the second area DR2 is disposed at right and left edges of the display device 10 will be mainly described below.

The cover window 100 may be disposed on the display panel 300 to cover an upper surface of the display panel 300. Thus, the cover window 100 may function to protect the upper surface of the display panel 300.

The cover window 100 may include a light transmitting portion DA100 corresponding to the display panel 300 and a light shielding portion NDA100 corresponding to an area other than the display panel 300. The cover window 100 may be disposed in the first area DR1 and the second areas DR2. The light transmitting portion DA100 may be disposed in a part of the first area DR1 and a part of each of the second areas DR2. The light shielding portion NDA 100 may be opaque. Alternatively, the light shielding portion NDA100 may be formed as a decorative layer having a pattern that may be shown to a user when an image is not displayed.

The display panel 300 may be disposed under the cover window 100. The display panel 300 may be overlapped by the light transmitting portion 100DA of the cover window 100. The display panel 300 may be disposed in the first area DR1 and the second areas DR2. Therefore, an image of the display panel 300 can be seen not only in the first area DR1 but also in the second areas DR2.

The display panel 300 may be a light emitting display panel including light emitting elements. For example, the display panel 300 may be an organic light emitting display panel using organic light emitting diodes that include organic light emitting layers, a micro light emitting diode display panel using micro light emitting diodes, a quantum dot light emitting display panel including quantum dot light emitting diodes that include quantum dot light emitting layers, or an inorganic light emitting display panel using inorganic light emitting elements that include inorganic semiconductors. A case in which the display panel 300 is an organic light emitting display panel will be mainly described below.

The display circuit board 310 and the display driver circuit 320 may be attached to a side of the display panel 300. An end of the display circuit board 310 may be attached onto pads provided on the side of the display panel 300 by using, for example, an anisotropic conductive film. The display circuit board 310 may be, for example, a flexible printed circuit board that can be bent, a rigid printed circuit board that is rigid and cannot be easily bent, or a printed circuit board.

The display driver circuit 320 receives control signals and power supply voltages through the display circuit board 310, and generates and outputs signals and voltages for driving the display panel 300. The display driver circuit 320 may be formed as an integrated circuit and attached onto the display panel 300 using, for example, a chip-on glass (COG) method, a chip-on plastic (COP) method, or an ultrasonic method. However, exemplary embodiments are not limited thereto. For example, in an exemplary embodiment, the display driver circuit 320 may be attached onto the display circuit board 310.

A touch driver circuit 330 may be disposed on the display circuit board 310. The touch driver circuit 330 may be formed as an integrated circuit and attached to an upper surface of the display circuit board 310. The touch driver circuit 330 may be electrically connected to touch electrodes of a touch sensor layer of the display panel 300 through the display circuit board 310. The touch driver circuit 330 may transmit touch driving signals to driving electrodes among the touch electrodes. The touch driver circuit 330 may output touch data including a user's touch coordinates by detecting changes in capacitances between the driving electrodes and sensing electrodes among the touch electrodes.

A first vibration driver circuit 340 and a second vibration driver circuit 350 may be disposed on the display circuit board 310. The first vibration driver circuit 340 receives first vibration data from a main processor 710. The first vibration driver circuit 340 generates first and second driving voltages according to the first vibration data, and outputs the first and second driving voltages to a first vibrating device 510. The second vibration driver circuit 350 receives second vibration data from the main processor 710. The second vibration driver circuit 350 generates third and fourth driving voltages according to the second vibration data, and outputs the third and fourth driving voltages to a second vibrating device 520.

A power supply circuit for supplying display driving voltages to drive the display driver circuit 320 may be disposed on the display circuit board 310. The display driving voltages for driving the display panel 300, the first and second driving voltages for driving the first vibrating device 510, and the third and fourth driving voltages for driving the second vibrating device 520 may be generated and supplied by different circuits, respectively. Accordingly, the display driving voltages for driving the display panel 300, the first and second driving voltages for driving the first vibrating device 510, and the third and fourth driving voltages for driving the second vibrating device 520 can be prevented from affecting each other. As a result, if a problem exists with relation to one of the driving voltages, the problem may be prevented from causing additional problems with relation to the other driving voltages.

A side of the flexible film 390 may be attached from under the display panel 300 onto the upper surface of the display panel 300 using, for example, an anisotropic conductive film. The other side of the flexible film 390 may be attached from above the display circuit board 310 onto the upper surface of the display circuit board 310 using, for example, an anisotropic conductive film. The flexible film 390 may be a flexible film that can be bent.

In exemplary embodiments, the flexible film 390 can be omitted, and the display circuit board 310 can be directly attached to a side of the display panel 300. In this case, the side of the display panel 300 may be bent toward a lower surface of the display panel 300.

The first vibrating device 510 and the second vibrating device 520 may be disposed on a surface of the display panel 300. The first vibrating device 510 may be, for example, a linear resonant actuator (LRA) that vibrates the display panel 300 and the bracket 600 by generating a magnetic force using a voice coil according to an applied voltage. The second vibrating device 520 may be, for example, a piezoelectric element or a piezoelectric actuator that vibrates the display panel 300 using a piezoelectric material that contracts or expands according to an applied voltage.

The bracket 600 may be disposed under the display panel 300. The bracket 600 may be rigid and provide structural support for the display device. In an exemplary embodiment, the size of the bracket 600 may substantially correspond to the size of the display device, providing structural support across the entire display device. The bracket 600 may include, for example, plastic, metal, or both plastic and metal. The bracket 600 may include a first camera hole CMH1 into which a camera device 720 is inserted, a battery hole BH in which a battery 790 is disposed, and a cable hole CAH through which a cable 314 connected to the display circuit board 310 passes. In addition, a first groove GR1 overlapping the first vibrating device 510 and a second groove GR2 overlapping the second vibrating device 520 may be formed in the bracket 600. In an exemplary embodiment, the bottom surface of the first vibrating device 510 may be attached to the bottom surface of the first groove GR1 (see FIG. 8).

The main circuit board 700 and the battery 790 may be disposed under the bracket 600. The main circuit board 700 may be, for example, a printed circuit board or a flexible printed circuit board.

The main circuit board 700 may include the main processor 710, the camera device 720, and a main connector 730. The camera device 720 may be disposed on both upper and lower surfaces of the main circuit board 700, the main processor 710 may be disposed on the upper surface of the main circuit board 700, and the main connector 730 may be disposed on the lower surface f the main circuit board 700.

The main processor 710 may control all or most of the functions of the display device 10. For example, the main processor 710 may output digital video data to the display driver circuit 320 through the display circuit board 310 so that the display panel 300 displays an image. In addition, the main processor 710 may receive touch data from the touch driver circuit 330, determine a user's touch coordinates, and then execute an application indicated by an icon displayed at the user's touch coordinates.

The main processor 710 may output the first vibration data to the first vibration driver circuit 340 to vibrate the display panel 300 and the bracket 600 using the first vibrating device 510. The first vibration data generated in a sound mode in which a first sound is output by vibrating the display panel 300 using the first vibrating device 510 may be different from the first vibration data generated in a haptic mode in which haptic feedback is provided by vibrating the bracket 600 using the first vibrating device 510. The sound mode and the haptic mode are described in further detail below. In addition, the main processor 710 may generate the first vibration data such that haptic feedback is provided while the first sound is output.

Herein, it is to be understood that the term "haptic feedback" does not refer to vibrations that may be felt by the user of the display device that occur merely as a byproduct of the display device outputting a sound (e.g., the first sound). For example, when the first sound is generated, and especially as the volume of the first sound is increased, a small amount of vibration occurring in the display device may be noticed by the user. Such a vibration does not constitute "haptic feedback" as the term is used herein. Rather, as used herein, the term "haptic feedback" may refer to vibratory feedback specifically provided by the display device to convey certain information to the user by way of vibrations (not by way of sound). Thus, as described above, the first sound may be generated and output based on sound data, and the haptic feedback may be generated and provided based on vibration data which is distinct from the sound data.

The main processor 710 may output the second vibration data to the second vibration driver circuit 350 to vibrate the display panel 300 using the second vibrating device 520.

The main processor 710 may be for example, an application processor, a central processing unit, or a system chip formed as an integrated circuit.

The main processor 710 may provide the haptic mode and the sound mode, as described with reference to FIG. 25. The sound mode may include a mono mode and a stereo mode.

In the haptic mode, the main processor 710 may provide haptic feedback by vibrating the display panel 300 and the bracket 600 using the first vibrating device 510. In the mono mode, the main processor 710 may output a second sound by vibrating the display panel 300 using the second vibrating device 520. Alternatively, in the mono mode, the main processor 710 may output the second sound of a high frequency band by vibrating the display panel 300 using the second vibrating device 520 and output the first sound of a low frequency band by vibrating the display panel 300 and the bracket 600 using the first vibrating device 510. In the stereo mode, the main processor 710 may output a first stereo sound as the first sound by vibrating the display panel 300 and the bracket 600 using the first vibrating device 510 and output a second stereo sound as the second sound by vibrating the display panel 300 using the second vibrating device 520.

In addition, a sensor(s) capable of determining three-dimensional (3D) coordinates of the display device 10 such as, for example, a gyro sensor and/or an acceleration sensor, may be disposed on the main circuit board 700. The main processor 710 may determine the degree of tilt of the display device 10 based on data received from the sensor(s) capable of determining the 3D coordinates of the display device 10.

Figure 26:
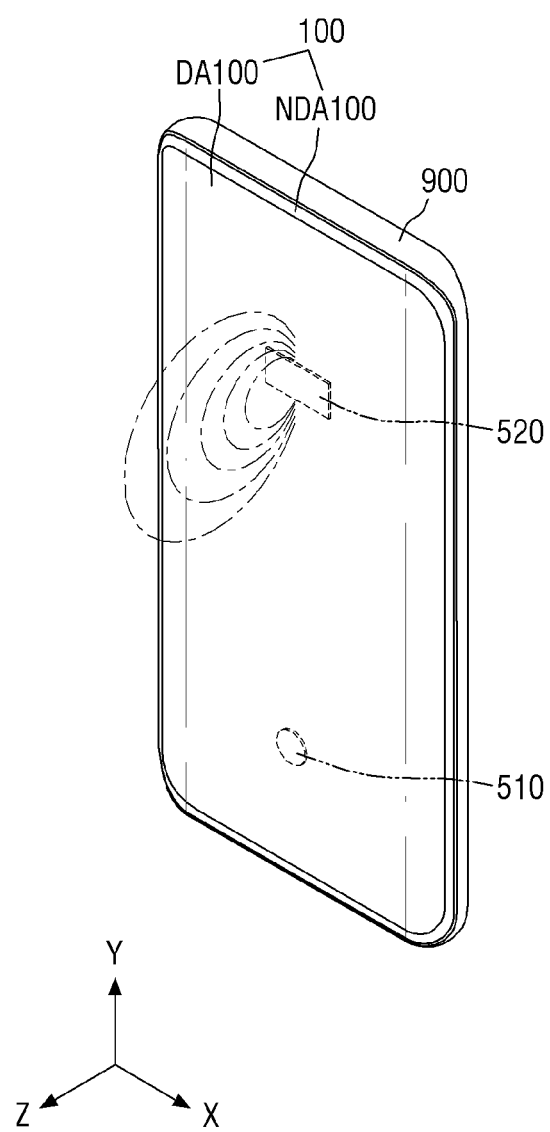
FIGS. 26 and 27 illustrate sound output according to three-dimensional (3D) coordinates of a display device according to an exemplary embodiment in a call mode.
Figure 28:
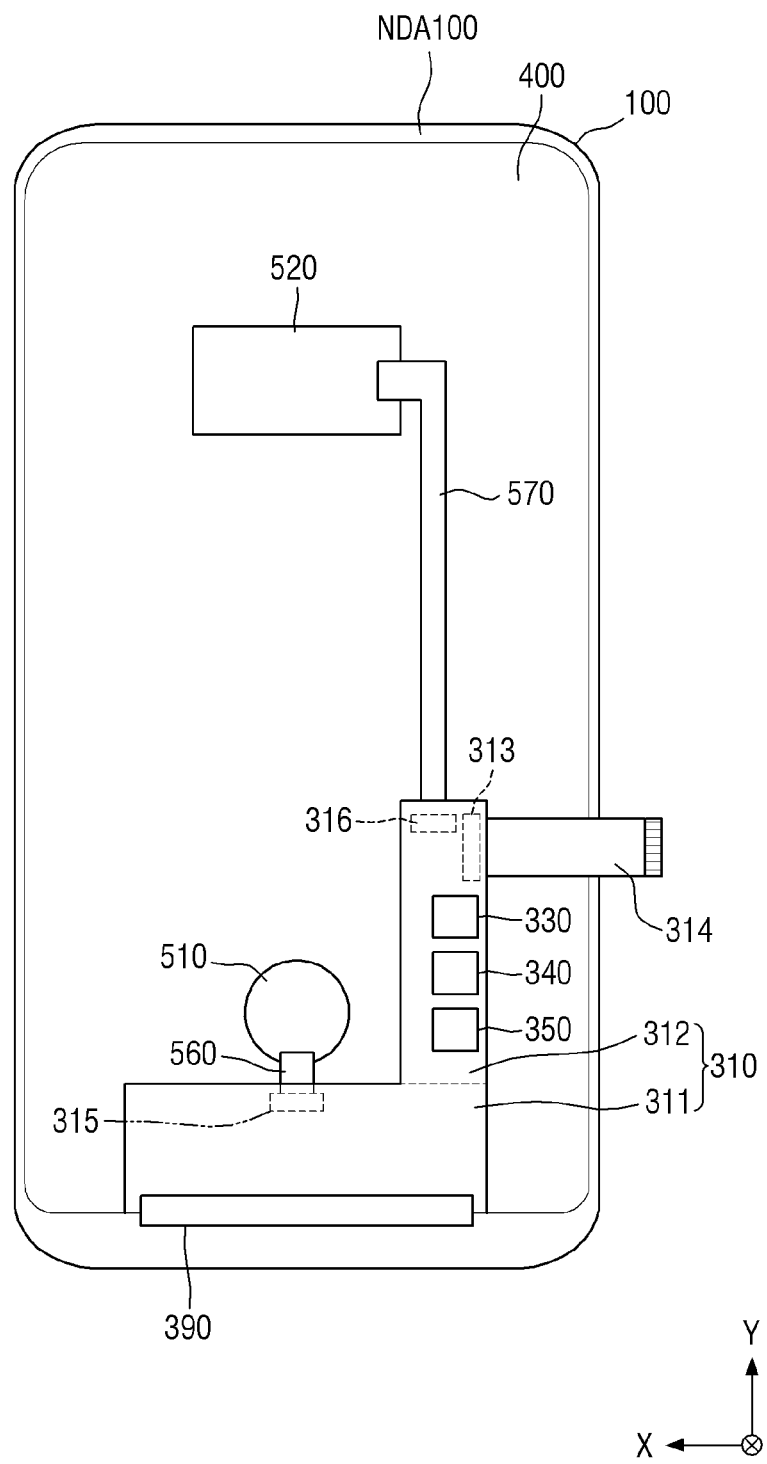
FIG. 28 is a bottom view of an example of the display panel of FIG. 2 attached to the cover window of FIG. 2 according to an exemplary embodiment.

The first vibrating device 510 may be disposed adjacent to a lower side of the display panel 300 as illustrated in FIG. 28, and the second vibrating device 520 may be disposed adjacent to an upper side of the display panel 300. In this case, when the display device 10 is tilted such that the first vibrating device 510 is located at a position higher than the second vibrating device 520 as illustrated in FIG. 26, the main processor 710 may determine that the first vibrating device 510 is disposed adjacent to a user's ear. Accordingly, the main processor 710 may output the first sound by vibrating the display panel 300 and the bracket 600 using the first vibrating device 510.

Figure 27:
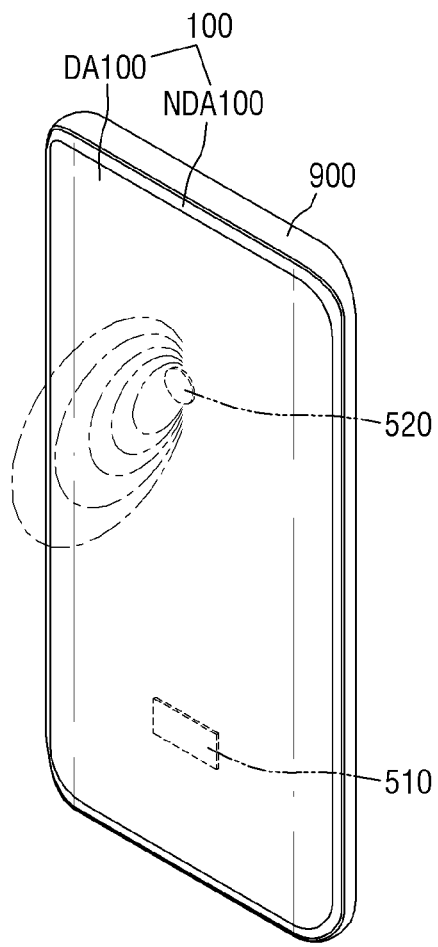

When the display device 10 is tilted such that the second vibrating device 520 is located higher than the first vibrating device 510, as illustrated in FIG. 27, the main processor 710 may determine that the second vibrating device 520 is disposed adjacent to the user's ear. Accordingly, the main processor 710 may output the second sound by vibrating the display panel 300 using the second vibrating device 520.

Thus, according to exemplary embodiments, the current use case of the display device may be determined (e.g., based on the position of the display device as held by the user), and the main processor 710 may leverage this information to intelligently choose which of the first vibrating device 510 and the second vibrating device 520 to utilize to output sounds.

The camera device 720 processes an image frame such as a still image or a moving image obtained by an image sensor in a camera mode, and outputs the processed image frame to the main processor 710.

The cable 314 passing through the cable hole CAH of the bracket 600 may be connected to the main connector 730, thus, electrically connecting the main circuit board 700 to the display circuit board 310.

In addition, the main circuit board 700 may further include a mobile communication module capable of transmitting or receiving a wireless signal to or from at least one of, for example, a base station, external terminal, and a server over a mobile communication network. The wireless signal may include, for example, a voice signal, a video call signal, or various types of data according to transmission/reception of text/multimedia messages.

The battery 790 may be disposed such that it does not overlap the main circuit board 700 in the third direction (Z-axis direction). The battery 790 may be overlapped by the battery hole BH of the bracket 600.

The lower cover 900 may be disposed under the bracket 600 and the main circuit hoard 700. The lower cover 900 may be fastened and fixed to the bracket 600. The lower cover 900 may form the lower exterior of the display device 10. The lower cover 900 may include, for example, plastic, metal, or both plastic and metal.

A second camera hole CMH2 exposing a lower surface of the camera device 720 may be formed in the lower cover 900. The position of the camera device 720 and the positions of the first and second camera holes CMH1 and CMH2 corresponding to the camera device 720 may vary, and are not limited to the exemplary embodiment illustrated in FIG. 2.

In FIGS. 1 and 2, the display device 10 outputs the first sound and provides haptic feedback by using the first vibrating device 510 while outputting the second sound using the second vibrating device 520. However, exemplary embodiments are not limited thereto. For example, in an exemplary embodiment, the second vibrating device 520 can be omitted from the display device 10. In this case, only the first vibrating device 510 may be used to output the first sound and provide haptic feedback.

Figure 3:
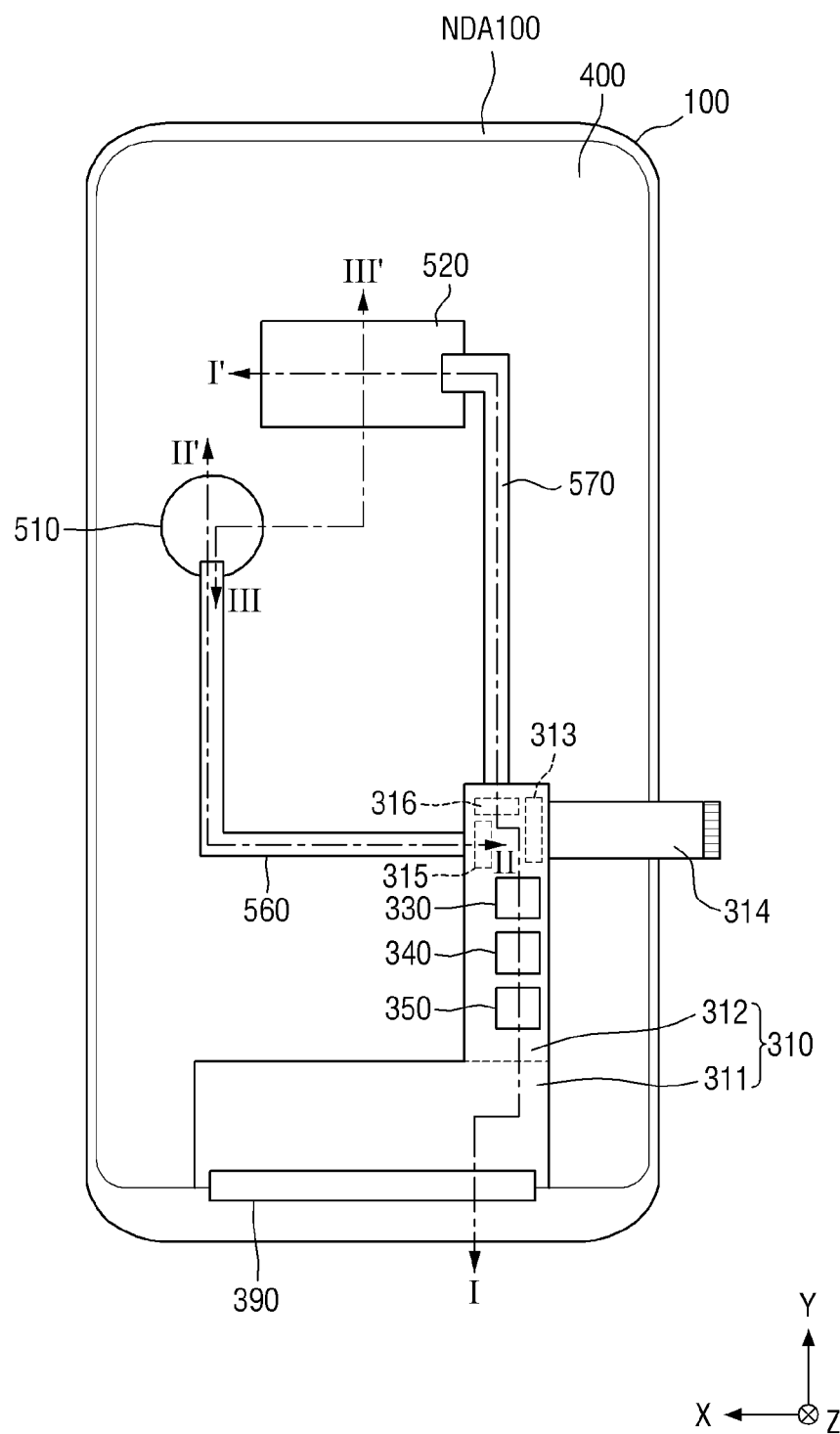
FIG. 3 is a bottom view of an example of a display panel attached to a cover window of FIG. 2.
Figure 4:
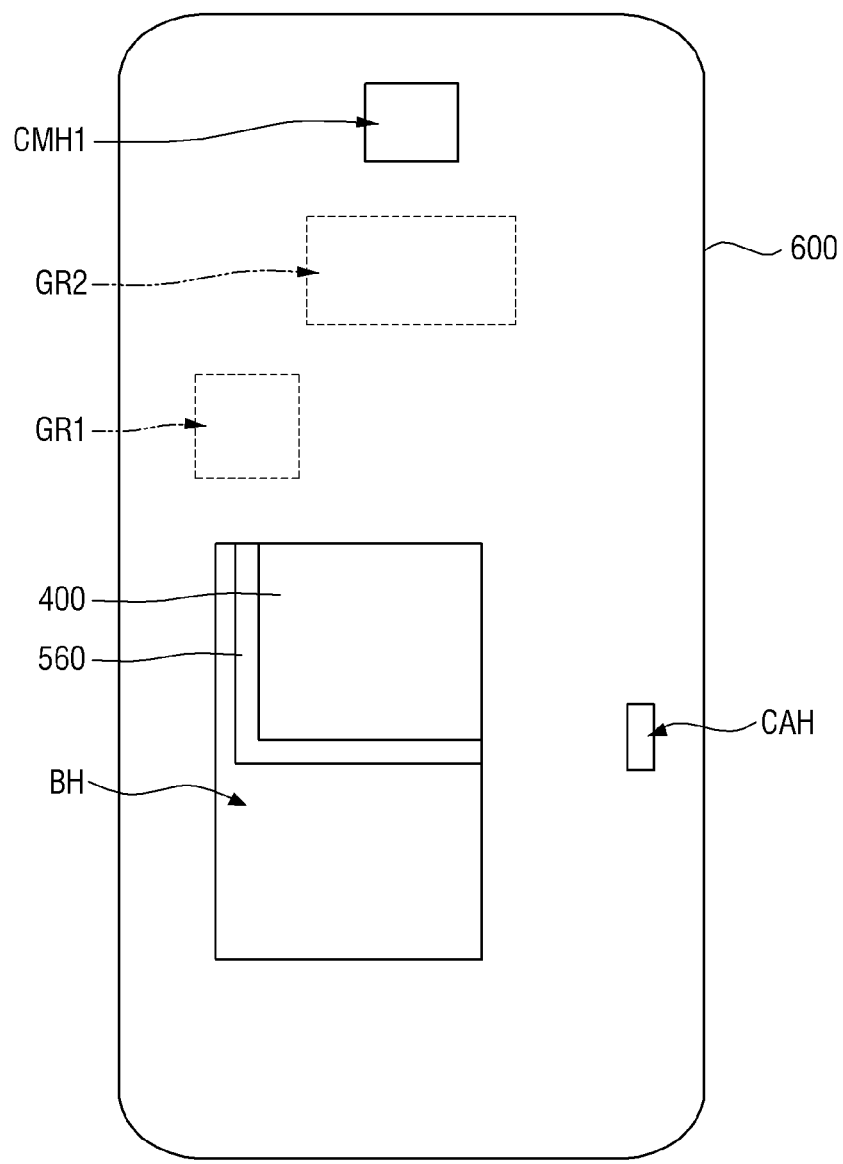
FIG. 4 is a bottom view of an example of a bracket attached to the bottom of the display panel of FIG. 3.
Figure 5:
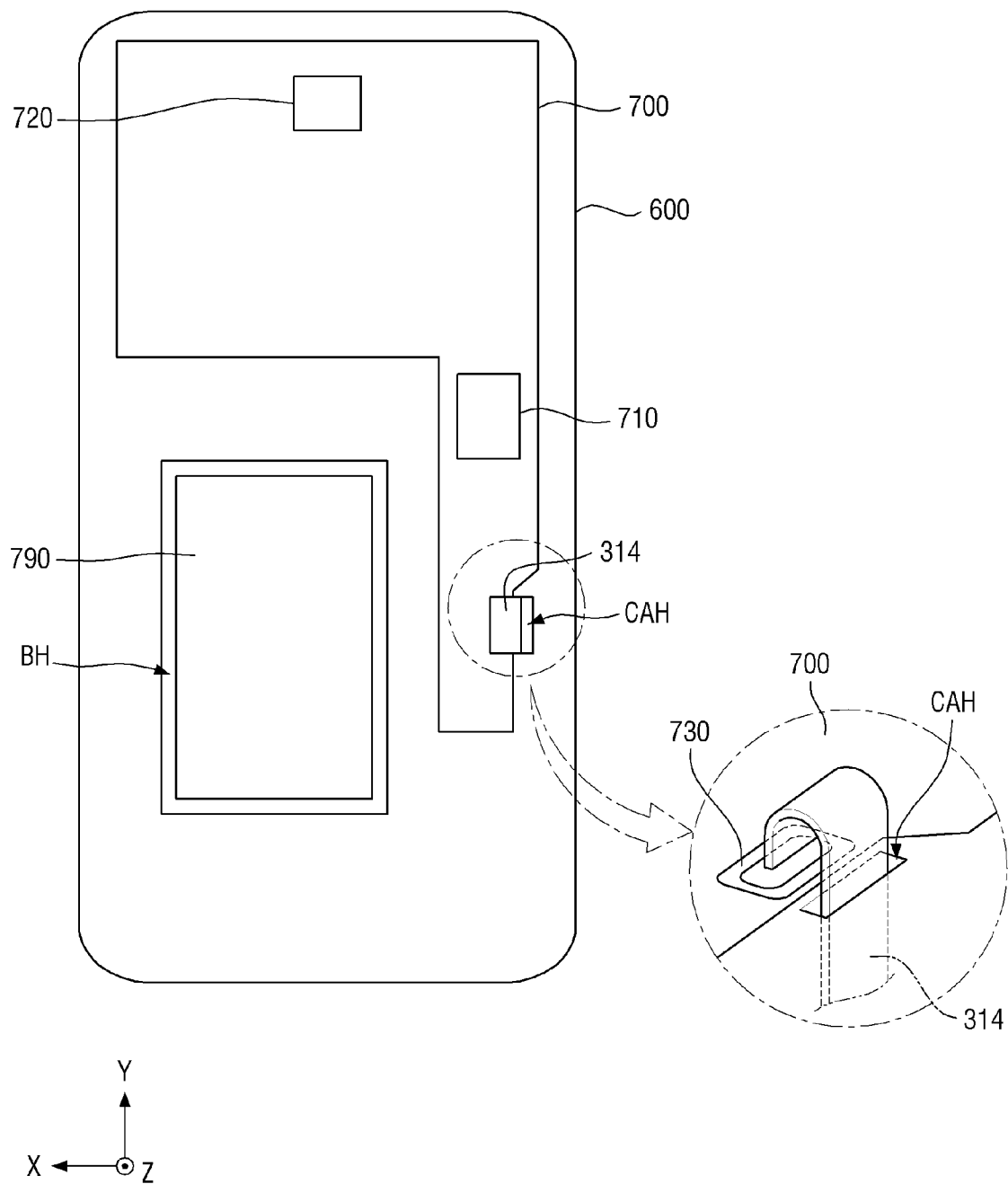
FIG. 5 is a bottom view of an example of a main circuit board disposed on the bracket of FIG. 4.

FIG. 3 is a bottom view of an example of the display panel 300 attached to the cover window 100 of FIG. 2. FIG. 4 is a bottom view of an example of the bracket 600 attached to the bottom of the display panel 300 of FIG. 3. FIG. 5 is a bottom view of an example of the main circuit board 700 disposed on the bracket 600 of FIG. 4.

Referring to FIGS. 3 through 5, a panel bottom cover 400 may be disposed under the display panel 300. The panel bottom cover 400 may be attached to the lower surface of the display panel 300 by an adhesive. The adhesive may be, for example, a pressure sensitive adhesive (PSA).

The panel bottom cover 400 may include at least one of a light absorbing member for absorbing light incident from the outside, a buffer member for absorbing external impact, and a heat dissipating member for efficiently dissipating the heat of the display panel 300.

The light absorbing member may be disposed under the display panel 300. The light absorbing member blocks transmission of light to prevent elements disposed under the light absorbing member, for example, the display circuit board 310, the vibrating device 510, etc. from being seen from above the display panel 300. For example, the light absorbing member may prevent these components from being visible to a user when using the display device. The light absorbing member may include a light absorbing material such as, for example, a black pigment or dye.

The buffer member may be disposed under the light absorbing member. The buffer member may absorb an external impact to prevent the display panel 300 from being damaged or to reduce the amount of damage caused to the display panel 300. The buffer member may be composed of a single layer or a plurality of layers. For example, the buffer member may be made of polymer resin such as polyurethane, polycarbonate, polypropylene or polyethylene, or may be made of an elastic material such as a sponge formed by foaming rubber, a urethane-based material or an acrylic-based material. The buffer member may be a cushion layer.

The heat dissipating member may be disposed under the buffer member. The heat dissipating member may include a first heat dissipating layer containing, for example, graphite or carbon nanotubes, and a second heat dissipating layer formed of a metal thin film (such as, e.g., copper, nickel, ferrite or silver) capable of shielding electromagnetic waves and having excellent thermal conductivity.

In exemplary embodiments, the panel bottom cover 400 can be omitted. In this case, elements disposed on a lower surface of the panel bottom cover 400 such as, for example, the display circuit board 310 and the vibrating device 510, may be disposed on the lower surface of the display panel 300 instead of the lower surface of the panel bottom cover 400.

The flexible film 390 attached to a side of the display panel 300 may be bent and disposed under the panel bottom cover 400, as illustrated in FIG. 3. Therefore, the display circuit board 310 attached to a side of the flexible film 390 may be disposed under the panel bottom cover 400. The display circuit board 310 disposed under the panel bottom cover 400 may be attached or bonded to the lower surface of the panel bottom cover 400 by a fixing member such as, for example, screws or an adhesive such as, for example, a PSA.

The display circuit board 310 may include a first circuit board 311 and a second circuit board 312. Each of the first circuit board 311 and the second circuit board 312 may be a rigid printed circuit board or a flexible printed circuit board. If any one of the first circuit board 311 and the second circuit board 312 is a rigid printed circuit board and the other is a flexible printed circuit board, the display circuit board 310 may be a composite printed circuit board.

In FIG. 3, the second circuit board 312 extends from a side of the first circuit board 311 in the second direction (Y-axis direction). A width of the second circuit board 312 in the first direction (X-axis direction) may be smaller than a width of the first circuit board 311 in the first direction (X-axis direction).

The touch driver circuit 330, the first vibration driver circuit 340 and the second vibration driver circuit 350 may be disposed on a surface of the second circuit board 312, and a first connector 313, a second connector 315 and a third connector 316 may be disposed on the other surface of the second circuit board 312. The first connector 313 may include an insertion portion connected to a first connection terminal provided at an end of the cable 314. The second connector 315 may include an insertion portion connected to a connection terminal provided at an end of a first flexible circuit board 560. The third connector 316 may include an insertion portion connected to a connection terminal provided at an end of a second flexible circuit board 570.

The first connection terminal disposed at the end of the cable 314 may be inserted into the insertion portion of the first connector 313. A second connection terminal disposed at the other end of the cable 314 may be bent to be disposed under the main circuit board 700 through the cable hole CAH penetrating the bracket 600, and then may be inserted into an insertion portion of the main connector 730, as illustrated in FIGS. 4 and 5.

The first vibrating device 510 may be disposed on the lower surface of the panel bottom cover 400. The first vibrating device 510 may be attached to the lower surface of the panel bottom cover 400 by a first adhesive 610 (see FIG. 7) such as, for example, a PSA. Therefore, the display panel 300 may be vibrated by the first vibrating device 510 in the thickness direction (Z-axis direction).

The connection terminal provided at the end of the first flexible circuit board 560 may be inserted into the insertion portion of the second connector 315. The other end of the first flexible circuit board 560 may be connected to the first vibrating device 510.

The connection terminal provided at the end of the second flexible circuit board 570 may be inserted into the insertion portion of the third connector 316. The other end of the second flexible circuit board 570 may be connected to the second vibrating device 520.

The bracket 600 may include the first groove GR1, the second groove GR2, the battery hole BH, the cable hole CAH, and the first camera hole CMH1.

The first groove GR1 and the second groove GR2 may be provided in a first surface of the bracket 600. The first surface of the bracket 600 may be a surface facing the panel bottom cover 400. The first groove GR1 and the second groove GR2 may be grooves cut into the first surface of the bracket 600. The battery hole BH, the cable hole CAH, and the first camera hole CMH1 may be holes passing through the bracket 600.

In FIG. 4, the first groove GR1 is disposed above the battery hole BH in a plan view. However, the position of the first groove GR1 is not limited to this position. For example, in an exemplary embodiment, the first groove GR1 may be disposed to overlap the first vibrating device 510 in the third direction (Z-axis direction). Thus, the first groove GR1 may provide a location into which the first vibrating device 510 may be disposed. That is, since the first groove GR1 is a groove for accommodating the first vibrating device 510, the position of the first groove GR1 may be changed according to the position of the first vibrating device 510.

In FIG. 4, the second groove GR2 is disposed between the first camera hole CMH1 and the batter hole BH in a plan view. However, the position of the second groove GR2 is not limited to this position. For example, in an exemplary embodiment, the second groove GR2 may be disposed to overlap the second vibrating device 520 in the third direction (Z-axis direction) and may be disposed such that it does not overlap the battery hole BH, the cable hole CH and the first camera hole CMH1. Thus, the second groove GR2 may provide a location into which the second vibrating device 520 may be disposed. Since the second groove GR2 serves as a sound box of the second vibrating device 520, the position of the second groove GR2 may be changed according to the position of the second vibrating device 520. For example, the second groove GR2, which includes an open area, may assist in transferring sound from the display device such that the volume and quality of the sound is sufficient for the user to hear the sound.

Since the battery hole BH is a hole for accommodating a battery, the battery 790 may overlap the battery hole BH in the third direction (Z-axis direction), as illustrated in FIG. 5. The battery hole BH may be larger in size than the battery 790, as illustrated in FIG. 5. In addition, the first flexible circuit board 560 for connecting the first vibrating device 510 and the display circuit board 310 may overlap the battery hole BH in the third direction (Z-axis direction), as illustrated in FIG. 4.

Since the first camera hole CMH1 of the bracket 600 is a hole for accommodating the camera device 720 of the main circuit board 700, the camera device 720 may overlap the first camera hole CMH1 in the third direction (Z-axis direction).

According to the exemplary embodiment illustrated in FIGS. 3 through 5, the first vibrating device 510 may be electrically connected to the display circuit board 310 by the first flexible circuit board 560, the second vibrating device 520 may be electrically connected to the display circuit board 310 by the second flexible circuit board 570, and the main circuit board 700 and the display circuit board 310 may be electrically connected to each other by the cable 314.

Figure 6:
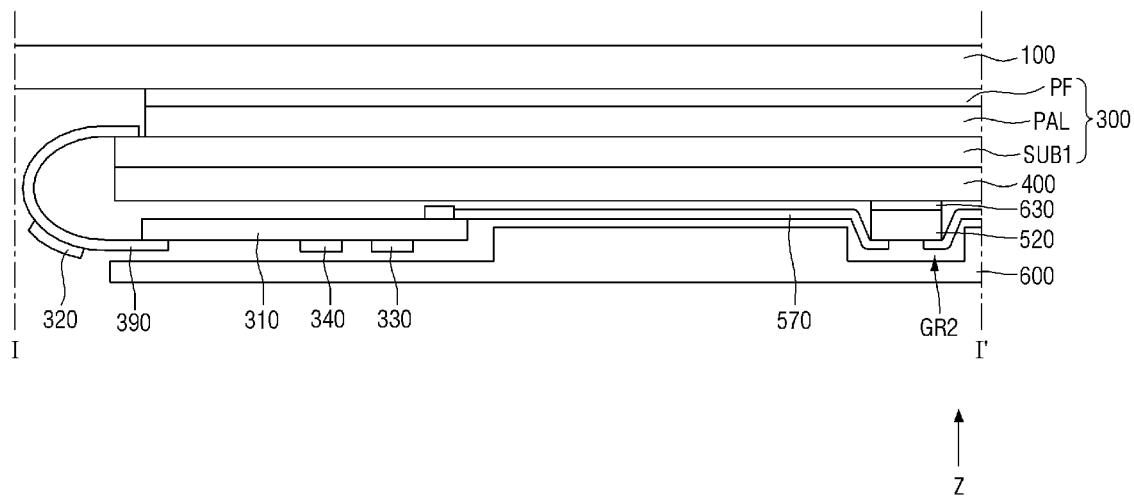
FIG. 6 is a cross-sectional view of the display panel FIG. 3 taken along line I-I' according to an exemplary embodiment.
Figure 7:
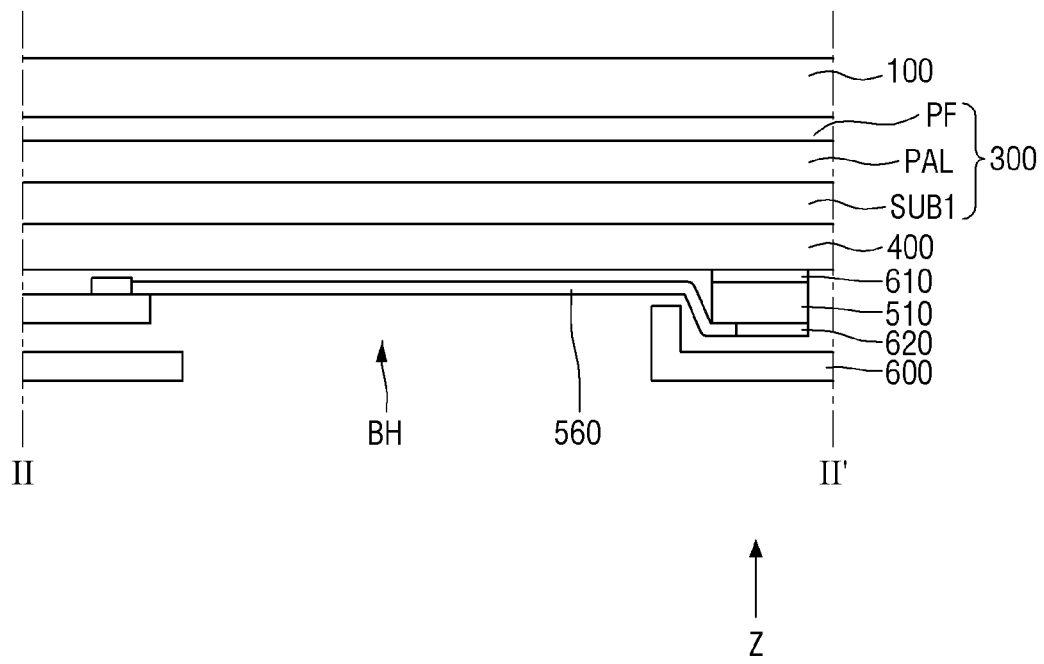
FIG. 7 is a cross-sectional view of the display panel of FIG. 3 taken along line II-II' according to an exemplary embodiment.
Figure 8:
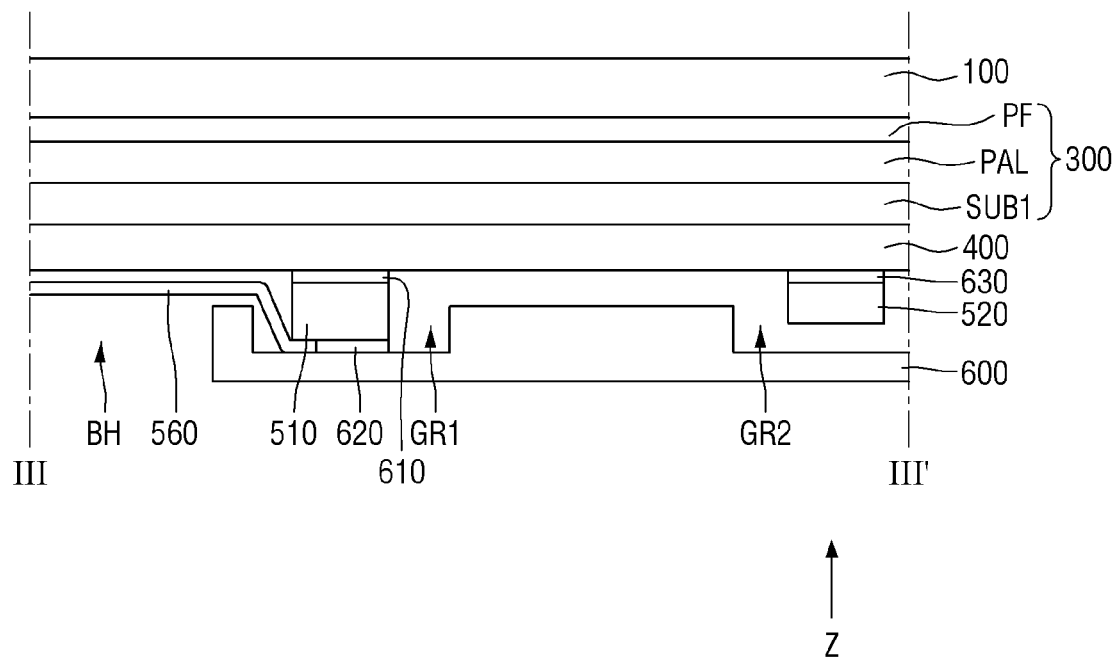
FIG. 8 is a cross-sectional view of the display panel of FIG. 3 taken along line III-III' according to an exemplary embodiment.

FIG. 6 is a cross-sectional view of the display panel of FIG. 3 taken along line I-I' according to an exemplary embodiment. FIG. 7 is a cross-sectional view of the display panel of FIG. 3 taken along line II-II' according to an exemplary embodiment. FIG. 8 is a cross-sectional view of the display panel of FIG. 3 taken along line III-III' according to an exemplary embodiment.

Referring to FIGS. 6 through 8, the display panel 300 may include a substrate SUB1, a pixel array layer PAL, and a polarizing film PF.

The substrate SUB1 may be a rigid substrate or a flexible substrate that can be bent, folded, and/or rolled. The substrate SUB1 may be made of an insulating material such as, for example, glass, quartz, or polymer resin. The polymer material may be, for example, polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyamide (PI), polycarbonate (PC), cellulose triacetate (CAT), cellulose acetate propionate (CAP), or a combination of the same. The substrate SUB1 may also include a metal material.

Figure 9:
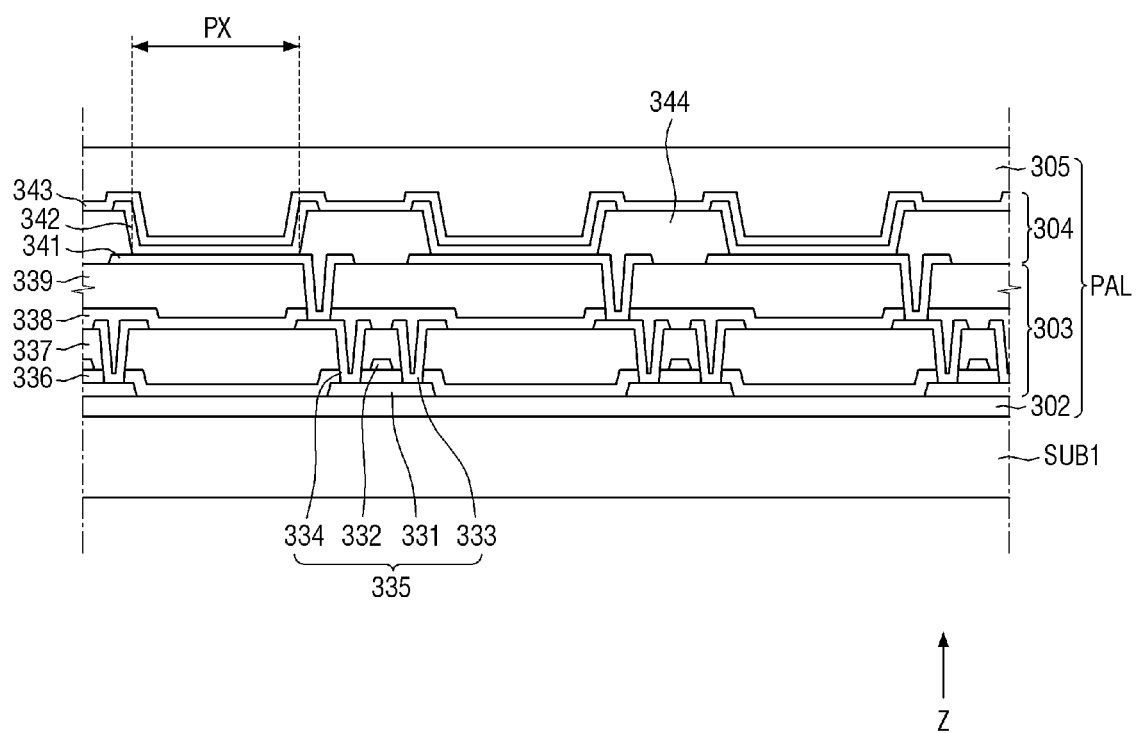
FIG. 9 is a detailed cross-sectional view of a display area of the display panel of FIGS. 6 through 8.

The pixel array layer PAL may be disposed on the substrate SUB1. The pixel array layer PAL may include pixels PX to display an image. The pixel array layer PAL may include a thin-film transistor layer 303, a light emitting element layer 304, and a thin-film encapsulation layer 305, as illustrated in FIG. 9.

The polarizing film PF may be disposed on the pixel array layer PAL, and may prevent a decrease in visibility due to reflection of external light. The polarizing film PF may include a linear polarizer and a retardation film such as a quarter-wave ($\lambda/4$) plate. For example, the retardation film may be disposed on the pixel array layer PAL, and the linear polarizer may be disposed between the retardation film and the cover window 100.

The panel bottom cover 400 may be disposed on a first surface of the display panel 300, and the cover window 100 may be disposed on a second surface of the display panel 300, which is a surface opposite the first surface. That is, the panel bottom cover 400 may be disposed on a lower surface of the substrate SUB1 of the display panel 300, and the cover window 100 may be disposed on an upper surface of the polarizing film PF.

One side of the flexible film 390 may be attached to a side of the substrate SUI31, and the other side of the flexible film 390 may be attached to a side of the display circuit board 310. The one side of the flexible film 390 may be attached to a surface of the substrate SUB1 by using, for example, an anisotropic conductive film. The other side of the flexible film 390 may be attached to a first surface of the display circuit board 310 by using, for example, an anisotropic conductive film. A second surface of the display circuit board 310, which is a surface opposite the first surface, may face the panel bottom cover 400.

Although the display driver circuit 320 is disposed on a surface of the flexible film 90 in FIG. 6, exemplary embodiments are not limited thereto. For example, in an exemplary embodiment, the display driver circuit 320 may be disposed on the other surface which is opposite the above surface of the flexible film 390. The other surface of the flexible film 390 may be a surface attached to the surface of the substrate SUB1 and the first surface of the display circuit board 310.

The display circuit board 310 may be disposed on the lower surface of the panel bottom cover 400. The display circuit board 310 may be fixed to the panel bottom cover 400 by a fixing member such as, for example, screws.

The touch driver circuit 330, the first vibration driver circuit 340, and the second vibration driver circuit 350 may be disposed on the surface of the display circuit board 310. The first connector 313, the second connector 315, and the third connector 316 may be disposed on the second surface of the display circuit board 310.

The first vibrating device 510 may be disposed between the panel bottom cover 400 and the bracket 600. A first surface of the first vibrating device 510 may be attached to the panel bottom cover 400 by the first adhesive 610, and a second surface of the first vibrating device 510 may be attached to the bracket 600 by a second adhesive 620. For example, the second surface of the first vibrating device 510 may be attached to a bottom surface of the first groove GR1 of the bracket 600 by the second adhesive 620.

The first vibrating device 510 may be attached to the panel bottom cover 400 and the bracket 600. Therefore, the display panel 300 and the bracket 600 may be vibrated by the vibration of the first vibrating device 510. For example, the first vibrating device 510 may output the first sound and provide haptic feedback by vibrating the display panel 300 and the bracket 600. The first adhesive 610 and the second adhesive 620 may be, for example, PSAs.

The first flexible circuit board 560 may be attached onto the second surface of the first vibrating device 510. In an exemplary embodiment, the second adhesive 620 does not overlap the first flexible circuit board 560 in the third direction (Z-axis direction), as illustrated in FIGS. 7 and 8. Alternatively, the second adhesive 620 may be disposed on the first flexible circuit board 560 attached to the second surface of the first vibrating device 510.

As shown in FIG. 7, in an exemplary embodiment, the first vibrating device 510 is disposed between a first surface (e.g., a lower surface) of the display panel 300 and a first surface (e.g., an upper surface) of the bracket 600 which faces the first surface of the display panel 300. For example, a first surface (e.g., an upper surface) of the first vibrating device 510 may be attached to the first surface of the display panel 300, and a second surface (e.g., a lower surface) of the first vibrating device 510 may be attached to the first surface of the bracket 600. The location of first vibrating device 510 allows the first vibrating device 510 to output a first sound or provide a haptic feedback by vibrating the display panel 300 and the bracket 600.

The second vibrating device 520 may be disposed between the panel bottom cover 400 and the bracket 600. A first surface of the second vibrating device 520 may be attached to the panel bottom cover 400 by a third adhesive 630. The second vibrating device 520 may be attached to the panel bottom cover 400. Therefore, the display panel 300 may be vibrated by the vibration of the second vibrating device 520. For example, the second vibrating device 520 may output the second sound by vibrating the display panel 300. The third adhesive 630 may be, for example, a PSA.

The second flexible circuit board 570 may be attached onto a second surface of the second vibrating device 520. In an exemplary embodiment, the third adhesive 630 does not overlap the second flexible circuit board 570 in the third direction (Z-axis direction), as illustrated in FIGS. 6 and 8. Alternatively, the third adhesive 630 may be disposed on the second flexible circuit board 570 attached to the second surface of the second vibrating device 520.

A gap may be provided between the second vibrating device 520 and the bracket 600. The gap between the second vibrating device 520 and the bracket 600 may serve as a sound box of the second sound output when the display panel 300 is vibrated by the second vibrating device 520.

When the first vibrating device 510 and the second vibrating device 520 are disposed on the heat dissipating member of the panel bottom cover 400, the first dissipating layer of the heat dissipating member may be damaged by the vibration of the first vibrating device 510 and the second vibrating device 520. Therefore, the heat dissipating member may be removed from an area in which the first vibrating device 510 and the second vibrating device 520 are disposed. In this case, the first vibrating device 510 and the second vibrating device 520 may be attached to a lower surface of the buffer member. Alternatively, the buffer member and the heat dissipating member may be removed from the area at which the first vibrating device 510 and the second vibrating device 520 are disposed. In this case, the first vibrating device 510 and the second vibrating device 520 may be attached to a lower surface of the light absorbing member.

The first flexible circuit board 560 may be attached to the second surface of the first vibrating device 510 using, for example, an anisotropic conductive film. Lead lines of the first flexible circuit board 560 may be connected to ends of a voice coil of the first vibrating device 510. The connection terminal provided at an end of the first flexible circuit board 560 may be connected to the lead lines. The connection terminal of the first flexible circuit board 560 may be inserted into the insertion portion of the second connector 315. The first flexible circuit board 560 may be, for example, a flexible printed circuit (FPC) or a flexible film.

The second flexible circuit board 570 may be attached to the second surface of the second vibrating device 520 using, for example, an anisotropic conductive film. Lead lines of the second flexible circuit board 570 may be connected to ends of a voice coil of the second vibrating device 520. The connection terminal provided at an end of the second flexible circuit board 570 may be connected to the lead lines. The connection terminal of the second flexible circuit board 570 may be inserted into the insertion portion of the third connector 316. The second flexible circuit board 570 may be, for example, an FPC or a flexible film.

According to the exemplary embodiment illustrated in FIGS. 6 through 8, since the first vibrating device 510 is attached to both the display panel 300 and the bracket 600, the first vibrating device 510 may vibrate both the display panel 300 and the bracket 600. Therefore, exemplary embodiments output the first sound by vibrating the display panel 300 using the first vibrating device 510, and provide haptic feedback by vibrating the bracket 600 using the first vibrating device 510. Thus, according to exemplary embodiments, both a sound and a haptic interface may be provided using one vibrating device.

In addition, since the second vibrating device 520 is attached to the display panel 300, the second vibrating device 520 may also vibrate the display panel 300. Therefore, the second sound may be output by vibrating the display panel 300 using the second vibrating device 520.

FIG. 9 is a detailed cross-sectional view of a display area of the display panel 300 of FIGS. 6 through 8.

Referring to FIG. 9, the display panel 300 may include the substrate SUB1 and the pixel array layer PAL. The pixel array layer PAL may include the thin-film transistor layer 303, the light emitting element layer 304, and the thin-film encapsulation layer 305.

A buffer layer 302 may be formed on the substrate SUB1. The buffer layer may be formed on the substrate SUB1 to protect thin-film transistors 335 and light emitting elements from moisture introduced through the substrate SUB1, which may be vulnerable to moisture penetration. The buffer layer 302 may be composed of a plurality of inorganic layers stacked alternately. For example, the buffer layer 302 may be a multilayer in which one or more inorganic layers selected from a silicon oxide (SiOx) layer, a silicon nitride (SiNx) layer, and SiON are alternately stacked. In exemplary embodiments, the buffer layer 302 can be omitted.

The thin-film transistor layer 303 is formed on the buffer layer 302. The thin-film transistor layer 303 includes the thin-film transistors 335, a gate insulating layer 336, an interlayer insulating film 337, a protective layer 338, and a planarization layer 339.

Each of the thin-film transistors 335 includes an active layer 331, a gate electrode 332, a source electrode 333, and a drain electrode 334. In FIG. 9, each of the thin-film transistors 335 is formed as a top-gate type in which the gate electrode 332 is located above the active layer 331. However, exemplary embodiments are not limited thereto. For example, in exemplary embodiments, each of the thin-film transistors 335 may be formed as a bottom-gate type in which the gate electrode 332 is located under the active layer 331, or a double-gate type in which the gate electrode 332 is located both above and under the active layer 331.

The active layers 331 are formed on the buffer layer 302. The active layers 331 may be made of, for example, a silicon-based semiconductor material or an oxide-based semiconductor material. A light shielding layer may be formed between the buffer layer 302 and the active layers 331, and may block external light from entering the active layers 331.

The gate insulating layer 336 may be formed on the active layers 331. The gate insulating layer 336 may be an inorganic layer such as, for example, a SiOx layer, a SiNx layer, or a multilayer composed of these layers.

The gate electrodes 332 and gate lines may be formed on the gate insulating layer 336. Each of the gate electrodes 332 and the gate lines may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

The interlayer insulating film 337 may be formed on the gate electrodes 332 and the gate lines. The interlayer insulating film 337 may be an inorganic layer such as, for example, a SiOx layer, a SiNx layer, or a multilayer composed of these layers.

The source electrodes 333, the drain electrodes 334, and data lines may be formed on the interlayer insulating film 337. Each of the source electrodes 333 and the drain electrodes 334 may be connected to an active layer 331 through a contact hole passing through the gate insulating layer 336 and the interlayer insulating film 337. Each of the source electrodes 333, the drain electrodes 334 and the data lines may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

The protective layer 338 for insulating the thin-film transistors 335 may be formed on the source electrodes 333, the drain electrodes 334, and the data lines. The protective layer 338 may be an inorganic layer such as, for example, a SiOx layer, a SiNx layer, or a multilayer composed of these layers.

The planarization layer 339 may be formed on the protective layer 338 to planarize steps due to the thin-film transistors 335. The planarization layer 339 may be made of an organic layer such as, for example, acryl resin, epoxy resin, phenolic resin, polyamide resin, or polyimide resin.

The light emitting element layer 304 is formed on the thin-film transistor layer 303. The light emitting element layer 304 includes the light emitting elements and a pixel defining layer 344.

The light emitting elements and the pixel defining layer 344 are formed on the planarization layer 339. The light emitting elements may be organic light emitting devices, each including an anode 341, a light emitting layer 342, and a cathode 343.

The anodes 341 may be formed on the planarization layer 339. The anodes 341 may be connected to the source electrodes 333 or the drain electrodes 334 of the thin-film transistors 335 through contact holes passing through the protective layer 338 and the planarization layer 339.

The pixel defining layer 344 may be formed on the planarization layer 339 and may cover edges of the anodes 341 to define pixels PX. For example, the pixel defining layer 344 may serve as a pixel defining layer for defining the pixels PX. Each of the pixels PX is an area in which the anode 341, the light emitting layer 342 and the cathode 343 are sequentially stacked so that holes from the anode 341 and electrons from the cathode 343 combine together in the light emitting layer 342 to emit light.

The light emitting layers 342 are formed on the anodes 341 and the pixel defining layer 344. The light emitting layers 342 may be organic light emitting layers. Each of the light emitting layers 342 may emit one of red light, green light, and blue light. Alternatively, the light emitting layers 342 may be white light emitting layers which emit white light. In this case, the light emitting layers 342 may be a stack of a red light emitting layer, a green light emitting layer and a blue light emitting layer, and may be a common layer common to all of the pixels PX. In this case, the display panel 300 may further include color filters for displaying red, green and blue.

Each of the light emitting layers 342 may include a hole transporting layer, a light emitting layer, and an electron transporting layer. In addition, each of the light emitting layers 342 may be formed in a tandem structure of two or more stacks, in which case a charge generating layer may be formed between the stacks.

The cathode 343 is formed on the light emitting layers 342. The cathode 343 may be formed to cover the light emitting layers 342. The cathode 343 may be a common layer common to all of the pixels PX.

When the light emitting element layer 304 is formed as a top emission type which emits light in an upward direction, the anodes 341 may be made of a metal material having high reflectivity such as, for example, a stacked structure (Ti/Al/Ti) of aluminum and titanium, a stacked structure (ITO/Al/ITO) of aluminum and indium tin oxide, an APC alloy, or a stacked structure (ITU/APC/ITO) of an APC alloy and indium tin oxide. The APC alloy is an alloy of silver (Ag), palladium (Pd), and copper (Cu). In addition, the cathode 343 may be made of a transparent conductive material (TCO) capable of transmitting light such as, for example, indium tin oxide (ITO) or indium zinc oxide (IZO), or a semi-transmissive conductive material such as magnesium (Mg), silver (Ag) or an alloy of Mg and Ag. When the cathode 343 is made of a semi-transmissive conductive material, the light output efficiency may be increased by a microcavity.

When the light emitting element layer 304 is formed as a bottom emission type which emits light in a downward direction, the anodes 341 may be made of a transparent conductive material (TCO) such as, for example, indium tin oxide (ITO) or indium zinc oxide (IZO), or a semi-transmissive conductive material such as, for example, magesium (Mg), silver (Ag) or an alloy of Mg and Ag. The cathode 343 may be made of a metal material having high reflectivity such as, for example, a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. When the anodes 341 are made of a semi-transmissive conductive material, the light output efficiency may be increased by a microcavity.

The thin-film encapsulation layer 305 is formed on the light emitting element layer 304. The thin-film encapsulation layer 305 may serve to prevent oxygen or moisture from permeating the light emitting layers 342 and the 343. To this end, the thin-film encapsulation layer 305 may include at least one inorganic layer. The inorganic layer may be made of, for example, silicon nitride, aluminum nitride, zirconium nitride, titanium nitride, hafnium nitride, tantalum nitride, silicon oxide, aluminum oxide, or titanium oxide. In addition, the thin-film encapsulation layer 305 may further include at least one organic layer. The organic layer may be formed to a sufficient thickness so as to prevent particles from penetrating the thin-film encapsulation layer 305 and entering the light emitting layers 342 and the cathode 343. The organic layer may include any one of, for example, epoxy, acrylate, and urethane acrylate.

The touch sensor layer may be formed on the thin-film encapsulation layer 305. When the touch sensor layer is disposed directly on the thin-film encapsulation layer 305, the thickness of the display device 10 can be reduced as compared with when a separate touch panel is attached onto the thin-film encapsulation layer 305.

The touch sensor layer may include touch electrodes for sensing a user's touch using a capacitance method, and touch lines for connecting pads and the touch electrodes. For example, the touch sensor layer may sense a user's touch using a self-capacitance method or a mutual capacitance method.

Figure 10:
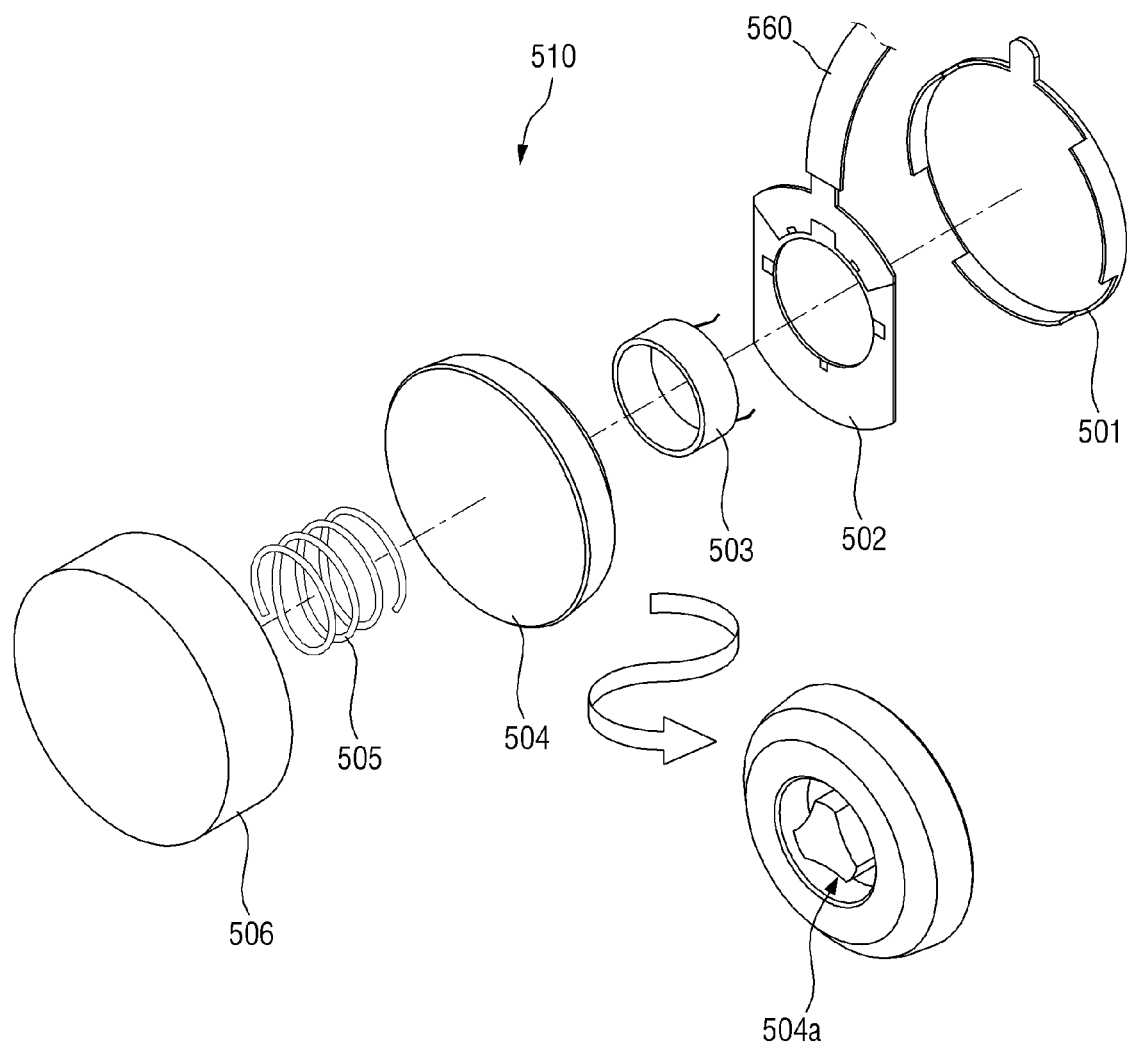
FIG. 10 is an exploded perspective view of a first vibrating device illustrated in FIGS. 7 and 8.

FIG. 10 is an exploded perspective view of the first vibrating device 510 illustrated in FIGS. 7 and 8.

Referring to FIG. 10, the first vibrating device 510 may be an LRA that vibrates the display panel 300 by generating a magnetic force using a voice coil. The first vibrating device 510 may include a lower chassis 501, a flexible circuit board 502, a voice coil 503, a magnet 504, a spring 505, and an upper chassis 506.

The lower chassis 501 and the upper chassis 506 may be made of a metal material. The flexible circuit board 502 is disposed on a surface of the lower chassis 501 which faces the upper chassis 506 and is connected to the first flexible circuit board 560. The voice coil 503 may be connected to a surface of the flexible circuit board 502 which faces the upper chassis 506. Therefore, one end of the voice coil 503 may be electrically connected to any one of the lead lines of the first flexible circuit board 560, and the other end of the voice coil 503 may be connected to another one of the lead lines. The magnet 504 may be a permanent magnet, and a voice coil groove 504a for accommodating the voice coil 503 may be formed in a surface facing the voice coil 503. An elastic body such as the spring 505 may be disposed between the magnet 504 and the upper chassis 506.

The direction of a current flowing through the voice coil 503 may be controlled by a first driving voltage applied to one end of the voice coil 503 and a second driving voltage applied to the other end of the voice coil 503. An applied magnetic field may be formed around the voice coil 503 according to the current flowing through the voice coil 503. For example, the direction of the current flowing through the voice coil 503 when the first driving voltage is a positive voltage and the second driving voltage is a negative voltage is opposite to the direction of the current flowing through the voice coil 503 when the first driving voltage is a negative voltage and the second driving voltage is a positive voltage. An attractive force and a repulsive force alternately act on the magnet 504 and the voice coil 503 according to the alternating current (AC) driving of the first driving voltage and the second driving voltage. Therefore, the magnet 504 may reciprocate between the voice coil 503 and the upper chassis 506 due to the spring 505.

Vibrations generated by the reciprocating motion of the magnet 504 may be transmitted to both the lower chassis 501 and the upper chassis 506. Therefore, the lower chassis 501 may be placed to face the bracket 600, and the upper chassis 506 may be placed to face the display panel 300. Alternatively, the lower chassis 501 may face the display panel 300, and the upper chassis 506 may face the bracket 600.

According to the exemplary embodiment illustrated in FIG. 10, the reciprocating motion of the magnet 504 of the first vibrating device 510 may cause the display panel 300 to vibrate to output the first sound and cause the bracket 600 to vibrate to provide haptic feedback.

Figure 11:
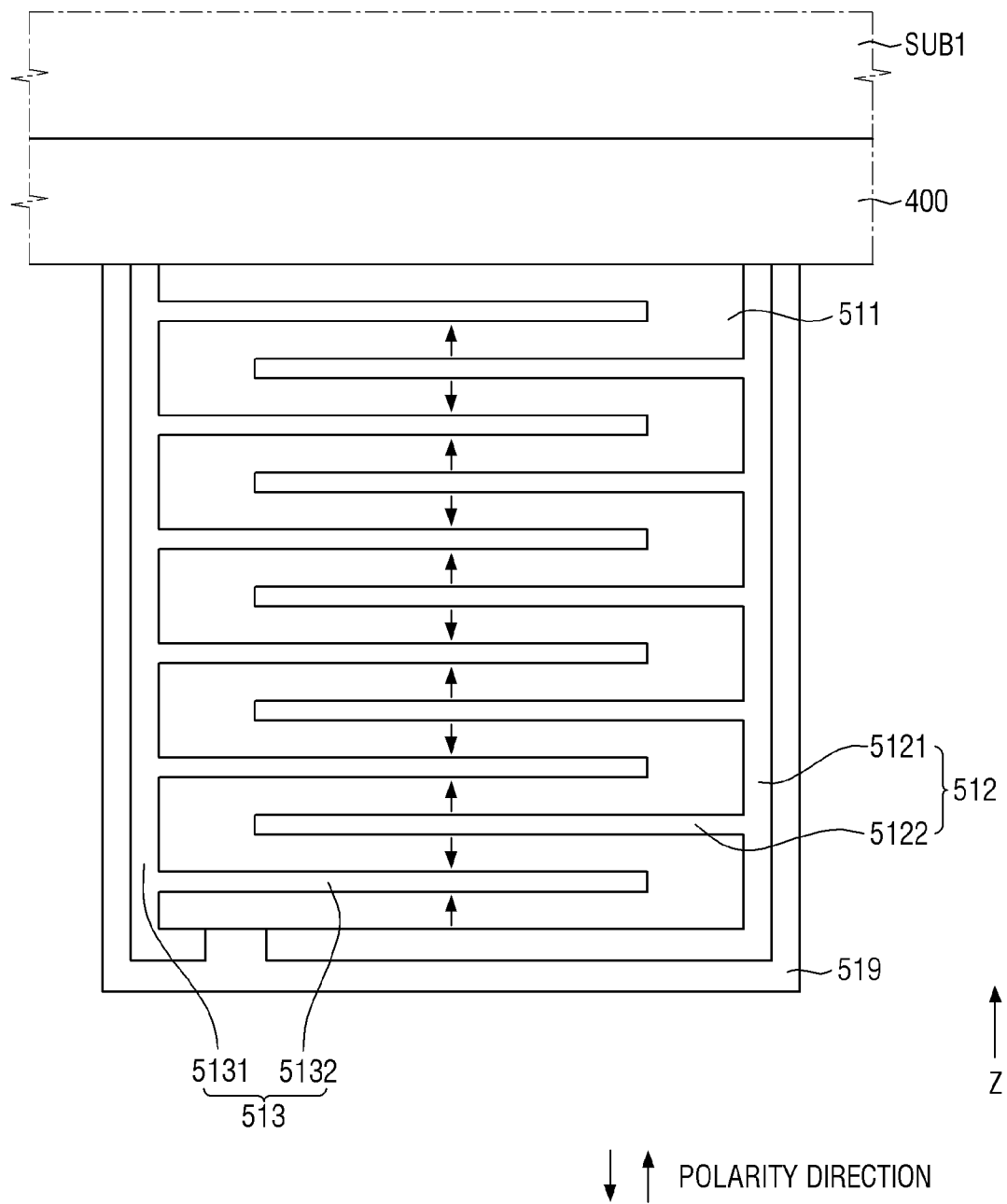
FIG. 11 is a detailed cross-sectional view of a second vibrating device illustrated in FIGS. 6 and 8.
Figure 12:
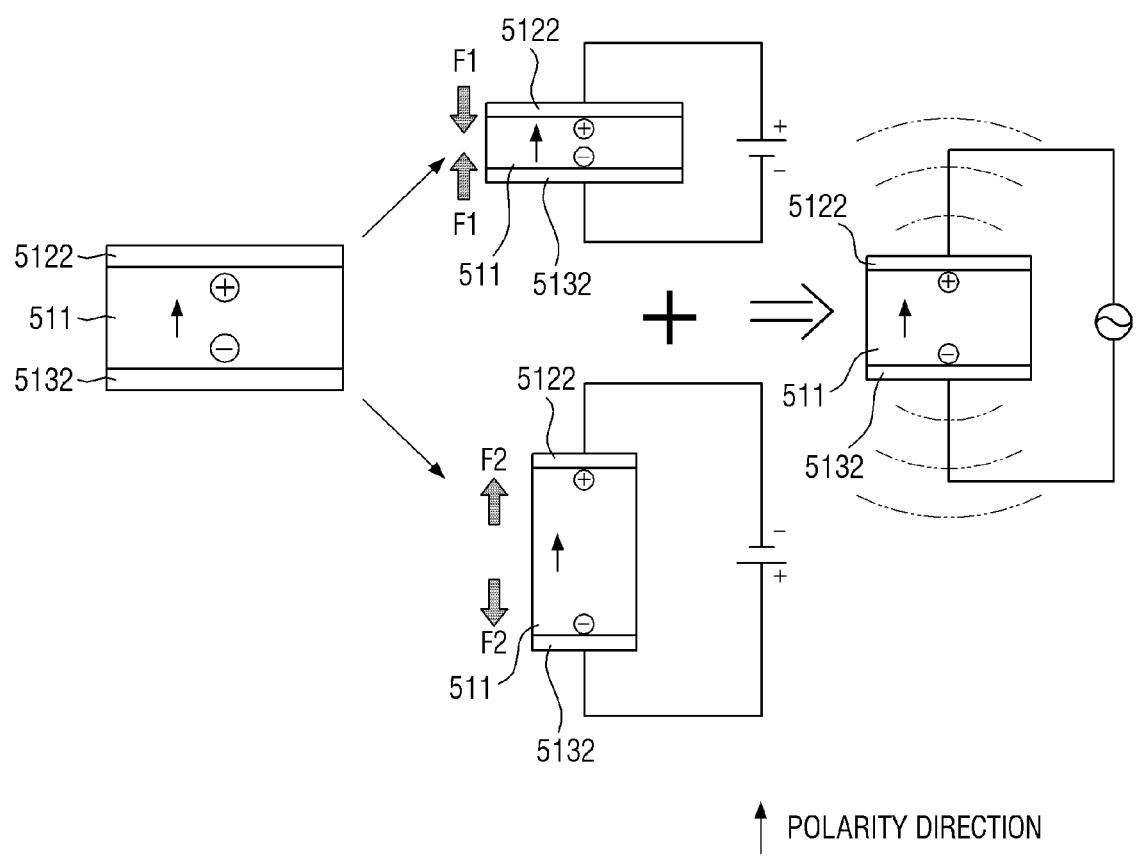
FIG. 12 illustrates a method of vibrating a vibration layer disposed between a first branch electrode and a second branch electrode of the second vibrating device illustrated in FIG. 11.

FIG. 11 is a detailed cross-sectional view of the second vibrating device 520 illustrated in FIGS. 6 and 8. FIG. 12 illustrates a method of vibrating a vibration layer 511 disposed between a first branch electrode 5122 and a second branch electrode 5132 of the second vibrating device 520 illustrated in FIG. 11.

Referring to FIGS. 11 and 12, the second vibrating device 520 may be a piezoelectric element or a piezoelectric actuator that vibrates the display panel 300 using a piezoelectric material that contracts or expands according to an applied voltage. The second vibrating device 520 may include the vibration layer 511, a first electrode 512, and a second electrode 513.

The first electrode 512 may include a first stem electrode 5121 and first branch electrodes 5122. The first stem electrode 5121 may be disposed on at least one side surface of the vibration layer 511, as illustrated in FIG. 11. Alternatively, the first stem electrode 5121 may penetrate a part of the vibration layer 511. The first stem electrode 5121 may also be disposed on an upper surface of the vibration layer 511. The first branch electrodes 5122 may branch from the first stem electrode 5121. The first branch electrodes 5122 may be arranged parallel to each other.

The second electrode 513 may include a second stem electrode 5131 and second branch electrodes 5132. The second electrode 513 may be spaced apart from the first electrode 512 and electrically insulated from the first electrode 512. The second stem electrode 5131 may be disposed on at least one side surface of the vibration layer 511. In this case, the first stem electrode 5121 may be disposed on a first side surface of the vibration layer 511, and the second stem electrode 5131 may be disposed on a second side surface of the vibration layer 511. Alternatively, the second stem electrode 5131 may penetrate a part of the vibration layer 511. The second stem electrode 5131 may be disposed on the upper surface of the vibration layer 511. The second branch electrodes 5132 may branch from the second stem electrode 5131. The second branch electrodes 5132 may be arranged parallel to each other.

The first branch electrodes 5122 and the second branch electrodes 5132 may be arranged parallel to each other in a horizontal direction (X-axis or Y-axis direction). In addition, the first branch electrodes 5122 and the second branch electrodes 5132 may be alternately arranged in a vertical direction (Z-axis direction). For example, the first branch electrodes 5122 and the second branch electrodes 5132 may be repeatedly arranged in the vertical direction (Z-axis direction) in the order of the first branch electrode 5122, the second branch electrode 5132, the first branch electrode 5122, and the second branch electrode 5132.

The first electrode 512 and the second electrode 513 may be connected to pads of the second flexible circuit board 570. The pads of the second flexible circuit board 570 may be connected to the first electrode 512 and the second electrode 513 disposed on a surface of the second vibrating device 520.

The vibration layer 511 may be a piezoelectric element that is deformed according to a driving voltage applied to the first electrode 512 and a driving voltage applied to the second electrode 513. In this case, the vibration layer 511 may be any one of a piezoelectric material such as, for example, a polyvinylidene fluoride (PVDF) film or plumbum zirconate titanate (PZT), and an electroactive polymer.

Since the production temperature of the vibration layer 511 is high, the first electrode 512 and the second electrode 513 may be made of silver (Ag) having a high melting point or an alloy of Ag and palladium (Pd). When the first electrode 512 and the second electrode 513 are made of an alloy of Ag and Pd to raise melting points of the first electrode 512 and the second electrode 513, the Ag content may be higher than the Pd content.

The vibration layer 511 may be disposed between each pair of the first and second branch electrodes 5122 and 5132. The vibration layer 511 may contract or expand according to a difference between a driving voltage applied to each first branch electrode 5122 and a driving voltage applied to a corresponding second branch electrode 5132.

Referring to FIG. 12, when the polarity direction of the vibration layer 511 disposed between a first branch electrode 5122 and a second branch electrode 5132 disposed under the first branch electrode 5122 is an upward direction (↑), the vibration layer 511 may have a positive polarity in an upper area adjacent to the first branch electrode 5122 and a negative polarity in a lower area adjacent to the second branch electrode 5132. In addition, when the polarity direction of the vibration layer 511 disposed between a second branch electrode 5132 and a first branch electrode 5122 disposed under the second branch electrode 5132 is a downward direction (↓), the vibration layer 511 may have a negative polarity in an upper area adjacent to the second branch electrode 5132 and a positive polarity in a lower area adjacent to the first branch electrode 5122. The polarity direction of the vibration layer 511 may be determined by a poling process of applying an electric field to the vibration layer 511 using a first branch electrode 5122 and a second branch electrode 5132.

When the polarity direction of the vibration layer 511 disposed between a first branch electrode 5122 and a second branch electrode 5132 disposed under the first branch electrode 5122 is the upward direction (↑) as illustrated in FIG. 12, if a driving voltage of the positive polarity is applied to the first branch electrode 5122 and a driving voltage of the negative polarity is applied to the second branch electrode 5132, the vibration layer 511 may contract according to a first force F1. The first force F1 may be a compressive force. Also, if a driving voltage of the negative polarity is applied to the first branch electrode 5122 and a driving voltage of the positive polarity is applied to the second branch electrode 5132, the vibration layer 511 may expand according to a second force F2. The second force F2 may be a tensile force.

Similarly to FIG. 12, when the polarity direction of the vibration layer 511 disposed between a second branch electrode 5132 and a first branch electrode 5122 disposed under the second branch electrode 5132 is the downward direction (↓), if a driving voltage of the positive polarity is applied to the second branch electrode 5132 and a driving voltage of the negative polarity is applied to the first branch electrode 5122, the vibration layer 511 may expand according to a tensile force. Also, if a driving voltage of the negative polarity is applied to the second branch electrode 5132 and a driving voltage of the positive polarity is applied to the first branch electrode 5122, the vibration layer 511 may contract according to a compressive force.

When a driving voltage applied to the first electrode 512 and a driving voltage applied to the second electrode 513 repeatedly alternate between the positive polarity and the negative polarity, the vibration layer 511 may repeatedly contract and expand, thus causing the second vibrating device 520 to vibrate. Since the second vibrating device 520 is disposed on a surface of the panel bottom cover 400, when the vibration layer 511 of the second vibrating device 520 contracts and expands, the display panel 300 may vibrate in the third direction (Z-axis direction), which is the thickness direction of the display panel 300, due to stress. As the display panel 300 is vibrated by the second vibrating device 520 in this way, the second sound may be output.

A protective layer 519 may be additionally disposed on the second surface and side surfaces of the second vibrating device 520. The protective layer 519 may be made of an insulating material or may be made of the same material as the vibration layer 511. The protective layer 519 may be disposed on the first electrode 512, the second electrode 513, and the vibration layer 511 exposed without being covered by the first electrode 512 and the second electrode 513. The protective layer 519 may surround the first electrode 512, the second electrode 513, and the vibration layer 511 exposed without being covered by the first electrode 512 and the second electrode 513. Therefore, the vibration layer 511, the first electrode 512 and the second electrode 513 of the second vibrating device 520 may be protected by the protective layer 519. In an exemplary embodiment, the protective layer 519 can be omitted.

Figure 13:
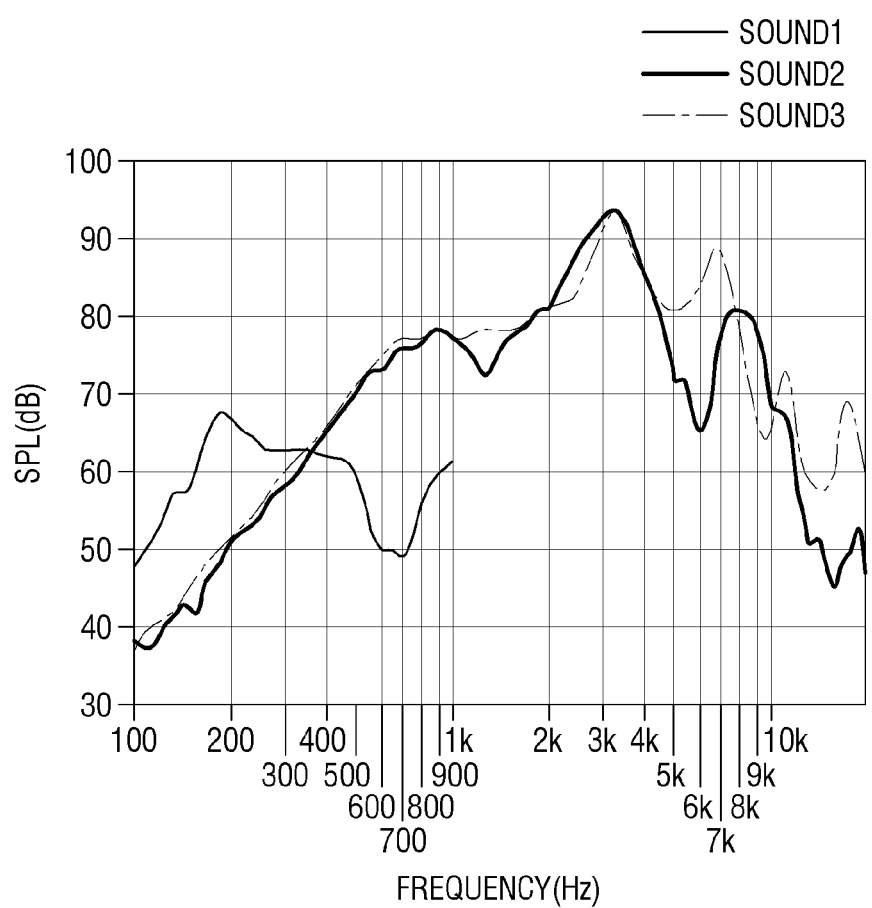
FIG. 13 is a graph of frequency versus sound pressure level (SPL) of each of a first sound output by a first vibrating device according to an exemplary embodiment, a second sound output by a second vibrating device according to an exemplary embodiment, and a sound output by a conventional speaker.

FIG. 13 is a graph of frequency versus sound pressure level (SPL) of each of the first sound output by the first vibrating device 510 according to an exemplary embodiment, the second sound output by the second vibrating device 520 according to an exemplary embodiment, and a sound output by a conventional speaker.

FIG. 13 illustrates a first sound SOUND1 output by vibrating the display panel 300 using the first vibrating device 510, a second sound SOUND2 output by vibrating the display panel 300 using the second vibrating device 520, and a third sound SOUND3 output by a conventional speaker. In FIG. 13, the X axis represents frequency (Hz), and the Y axis represents SPL (dB).

Referring to FIG. 13, the first sound SOUND1 may be a low-pitched sound having a high SPL in a low frequency band of about 150 Hz to about 500 Hz. For example, the SPL of the first sound SOUND1 may be about 60 dB or more at about 150 Hz to about 500 Hz.

The second sound SOUND2 may be a high-pitched sound having a high SPL in a high frequency band of about 500 Hz to 2 kHz. For example, the SPL of the second sound SOUND2 may be about 70 dB or more at about 500 Hz to about 10 kHz.

The third sound SOUND3 may be a high-pitched sound having a high SPL in a high frequency band of about 500 Hz to about 2 kHz. For example, the SPL of the third sound SOUND3 may be about 70 dB or more at about 500 Hz to about 10 kHz.

Since the display device 10 can output the first sound SOUND1 and the second sound SOUND2, bass can be enhanced as compared with when only the third sound SOUND3 is output by the conventional speaker. Therefore, the display device 10 according to exemplary embodiments can output a bass-enhanced sound as compared with when only the third sound SOUND3 is output by the conventional speaker.

Figure 14A:
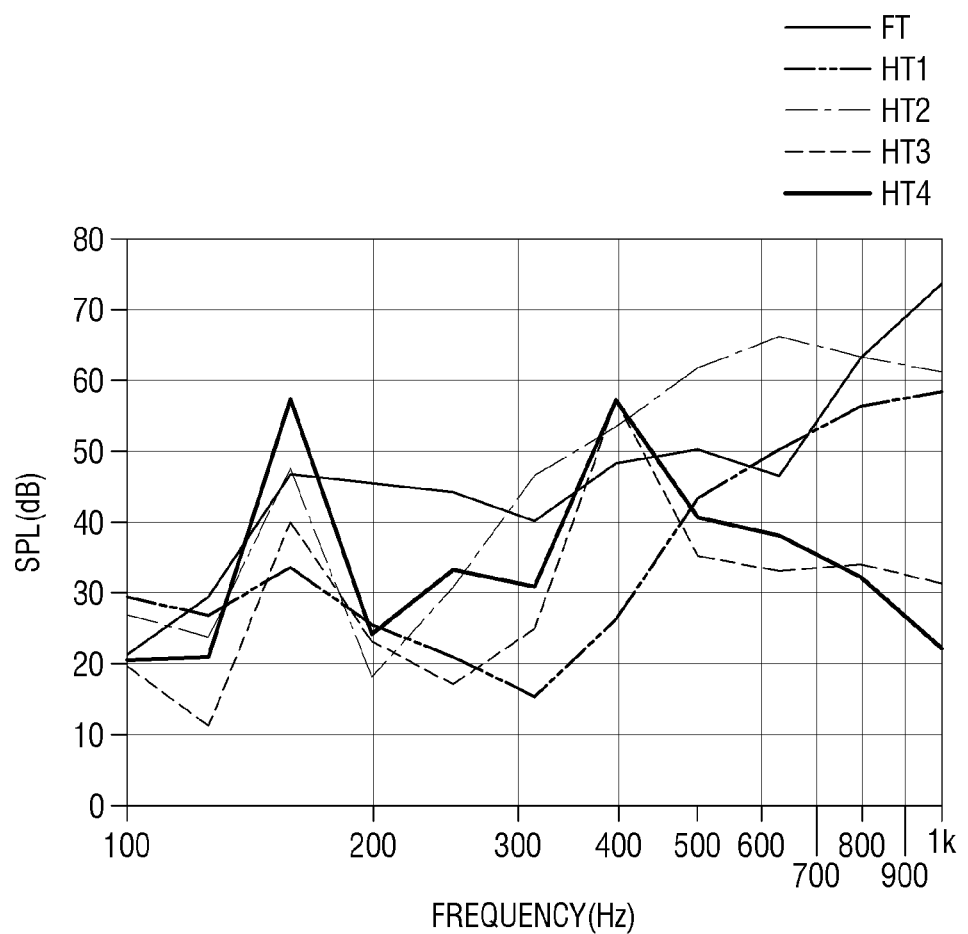
FIG. 14A is a graph of frequency versus SPL of a fundamental tone and harmonic overtones of a first sound output by a first vibrating device according to an exemplary embodiment when the first vibrating device is attached only to the display panel.
Figure 14B:
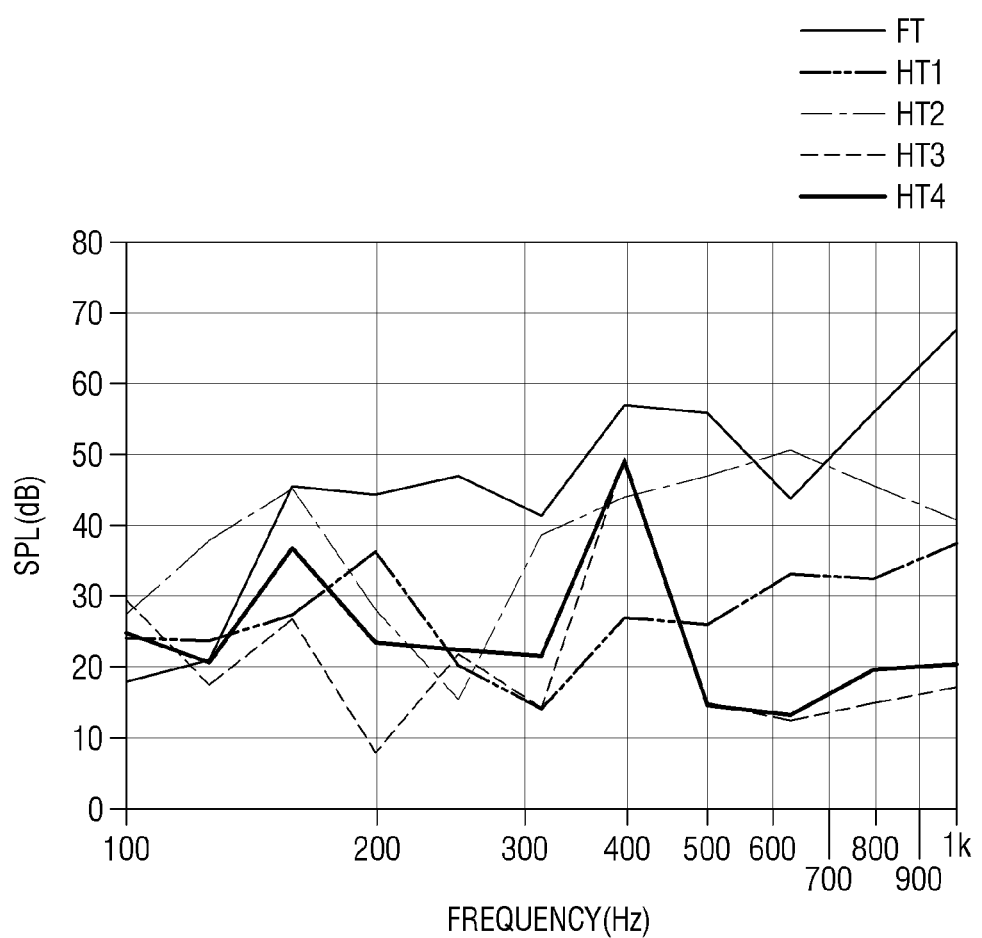
FIG. 14B is a graph of frequency versus SPL of the fundamental tone and the harmonic overtones of a first sound output by a first vibrating device according to an exemplary embodiment when the first vibrating device is attached only to the bracket.
Figure 14C:
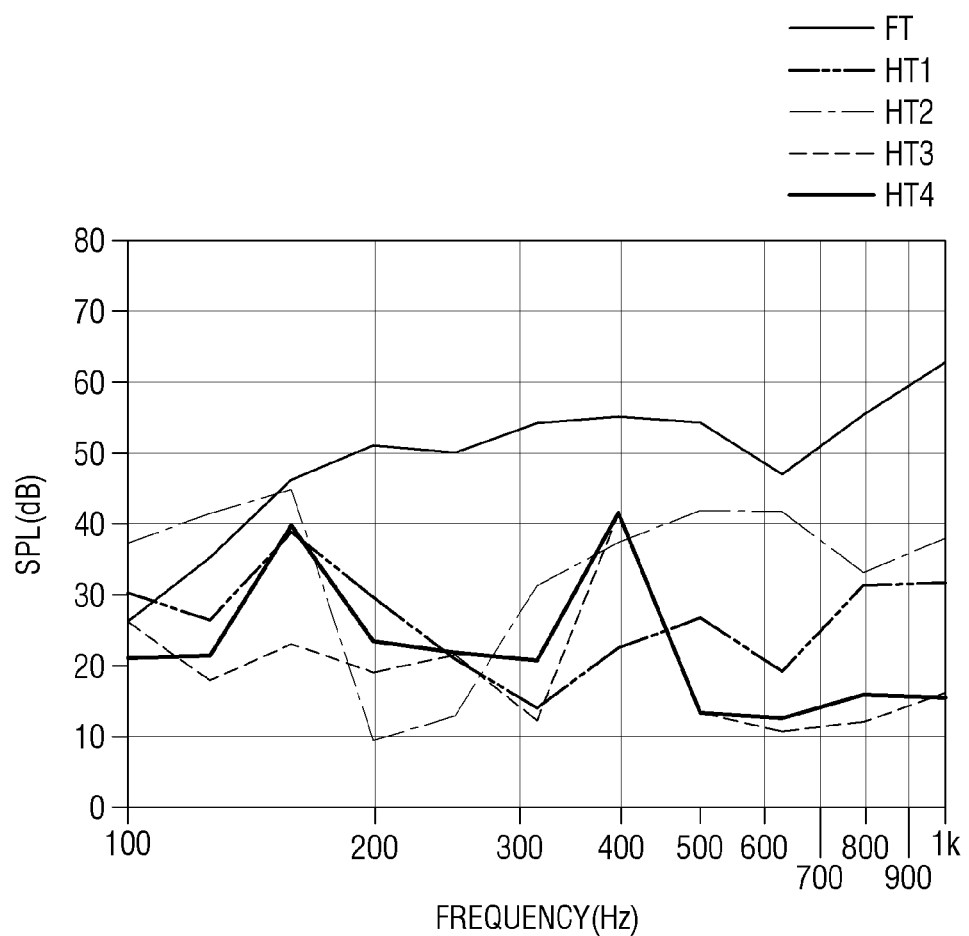
FIG. 14C is a graph of frequency versus SPL of the fundamental tone and the harmonic overtones of a first sound output by a first vibrating device according to an exemplary embodiment when the first vibrating device is attached to both the display panel and the bracket.

FIG. 14A is a graph of frequency versus SPL of a fundamental tone and harmonic overtones of the first sound output by the first vibrating device 510 according to an exemplary embodiment when the first vibrating device 510 is attached only to the display panel 300. FIG. 14B is a graph of frequency versus SPL of the fundamental tone and the harmonic overtones of the first sound output by the first vibrating device 510 according to an exemplary embodiment when the first vibrating device 510 is attached only to the bracket 600. FIG. 14C is a graph of frequency versus SPL of the fundamental tone and the harmonic overtones of the first sound output by the first vibrating device 510 according to an exemplary embodiment when the first vibrating device 510 is attached to both the display panel 300 and the bracket 600.

In FIGS. 14A through 14C, the first sound output by the first vibrating device 510 contains a fundamental tone FT and harmonic overtones. The harmonic overtones refer to overtones having frequencies that are integer multiples of the frequency of the fundamental tone FT. FIGS. 14A through 14C illustrate a first harmonic overtone HT1 corresponding to an overtone having a frequency about two times the frequency of the fundamental tone FT, a second harmonic overtone HT2 corresponding to an overtone having a frequency about three times the frequency of the fundamental tone FT, a third harmonic overtone HT3 corresponding to an overtone having a frequency about four times the frequency of the fundamental tone FT, and a fourth harmonic overtone HT4 corresponding to an overtone having a frequency about five times the frequency of the fundamental tone FT. In FIGS. 14A through 14C, the X axis represents frequency (Hz), and the Y axis represents SPL (dB).

Referring to FIG. 14A, when the first vibrating device 510 is attached only to the display panel 300, the SPL of the fundamental tone FT is lower than that of the fourth harmonic overtone HT4 in a frequency band of about 150 Hz to about 200 Hz. In addition, the SPL of the fundamental tone FT is lower than that of the second harmonic overtone HT2 in a frequency band of about 300 Hz to about 800 Hz. In addition, the SPL of the fundamental tone FT is lower than those of the third harmonic overtone HT3 and the fourth harmonic overtone HT4 in a frequency band of about 350 Hz to about 450 Hz.

Referring to FIG. 14B, when the first vibrating device 510 is attached to a second surface of the bracket 600 which is opposite the first surface facing the display panel 300, the SPL of the fundamental tone FT is lower than that of the second harmonic overtone HT2 in a frequency band of about 600 Hz to about 700 Hz.

Referring to FIG. 14C, when the first vibrating device 510 is attached to the display panel 300 and the first surface of the bracket 600, the SPL of the fundamental tone FT is higher than that of each of the first through fourth harmonic overtones HT1 through HT4 in a frequency band of about 150 Hz to about 1 kHz.

As illustrated in FIGS. 14A through 14C, in an exemplary embodiment, when the first vibrating device 510 is attached to both the display panel 300 and the bracket 600, the SPL of the fundamental tone FT is higher than that of each of the first through fourth harmonic overtones HT1 through HT4 in a frequency band of about 150 Hz to about 1 kHz. However, this is not the case when the first vibrating device 510 is attached only to the display panel 300 and when the first vibrating device 510 is attached only to the bracket 600. Therefore, as illustrated in FIG. 15, the total harmonic distortion (THD) of the first sound output by vibrating the display panel 300 using the first vibrating device 510 when the first vibrating device 510 is attached to both the display panel 300 and the bracket 600 may be lower than the THD of the first sound output when the first vibrating device 510 is attached only to the display panel 300 and the THD of the first sound output when the first vibrating device 510 is attached only to the bracket 600.

Figure 15:
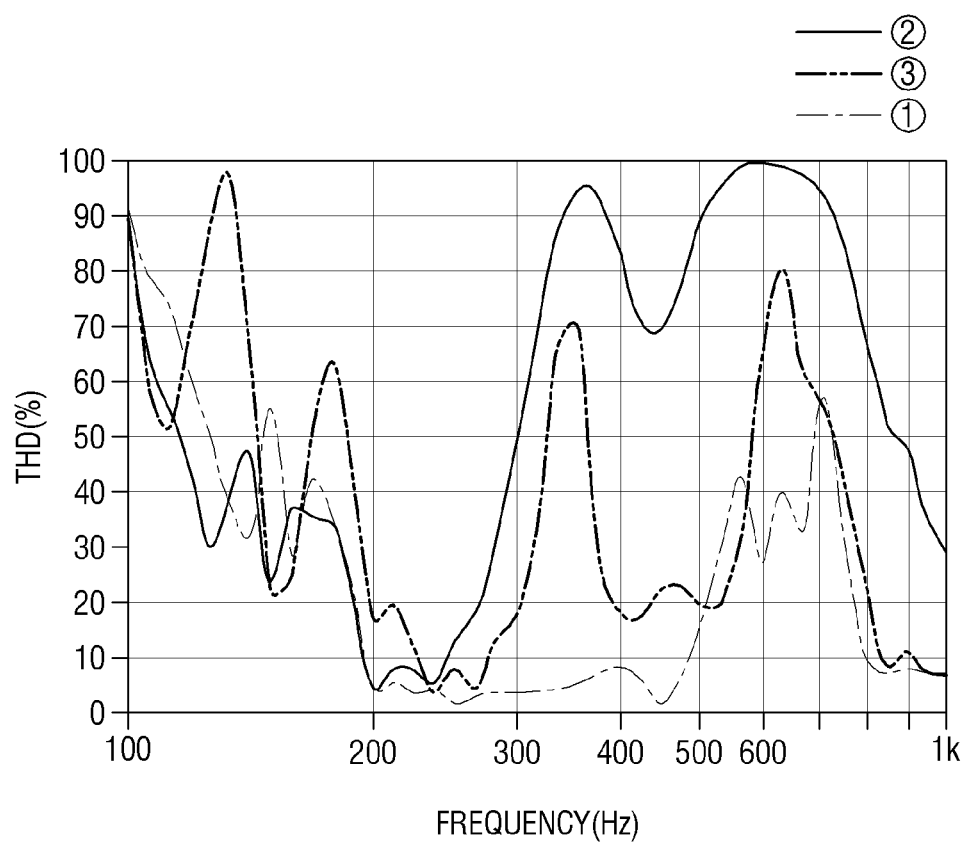
FIG. 15 is a graph of frequency versus total harmonic distortion (THD) of a first sound output when a first vibrating device according to an exemplary embodiment is attached to the display panel, when the first vibrating device according to an exemplary embodiment is attached to the bracket, and when the first vibrating device according to an exemplary embodiment is attached to both the display panel and the bracket.

FIG. 15 is a graph of frequency versus THD of the first sound output when the first vibrating device 510 according to an exemplary embodiment is attached to the display panel 300, when the first vibrating device 510 according to an exemplary embodiment is attached to the bracket 600, and when the first vibrating device 510 according to an exemplary embodiment is attached to both the display panel 300 and the bracket 600.

Referring to FIG. 15, the X axis represents frequency (Hz), and the Y axis represents the THD of the first sound. The THD of the first sound is an index indicating the degree of distortion of the fundamental tone due to the harmonic overtones.

In a frequency bank of about 150 Hz to about 1 kHz, the THD of the first sound output when the first vibrating device 510 is attached to both the display panel 300 and the bracket 600 (①) is mostly lower than the THD of the first sound output when the first vibrating device 510 is attached only to the display panel 300 (②) and the THD of the first sound output when the first vibrating device 510 is attached only to the bracket 600 (③). That is, the THD of the first sound output when the first vibrating device 510 is attached to both the display panel 300 and the bracket 600 may be lower than the THD of the first sound output when the first vibrating device 510 is attached only to the display panel 300 and the THD of the first sound output when the first vibrating device 510 is attached only to the bracket 600. Therefore, as illustrated in FIG. 15, the first sound having higher sound quality can be provided when the first vibrating device 510 is attached to both the display panel 300 and the bracket 600 than when the first vibrating device 510 is attached only to the display panel 300 and when the first vibrating device 510 is attached only to the bracket 600.

Figure 16:
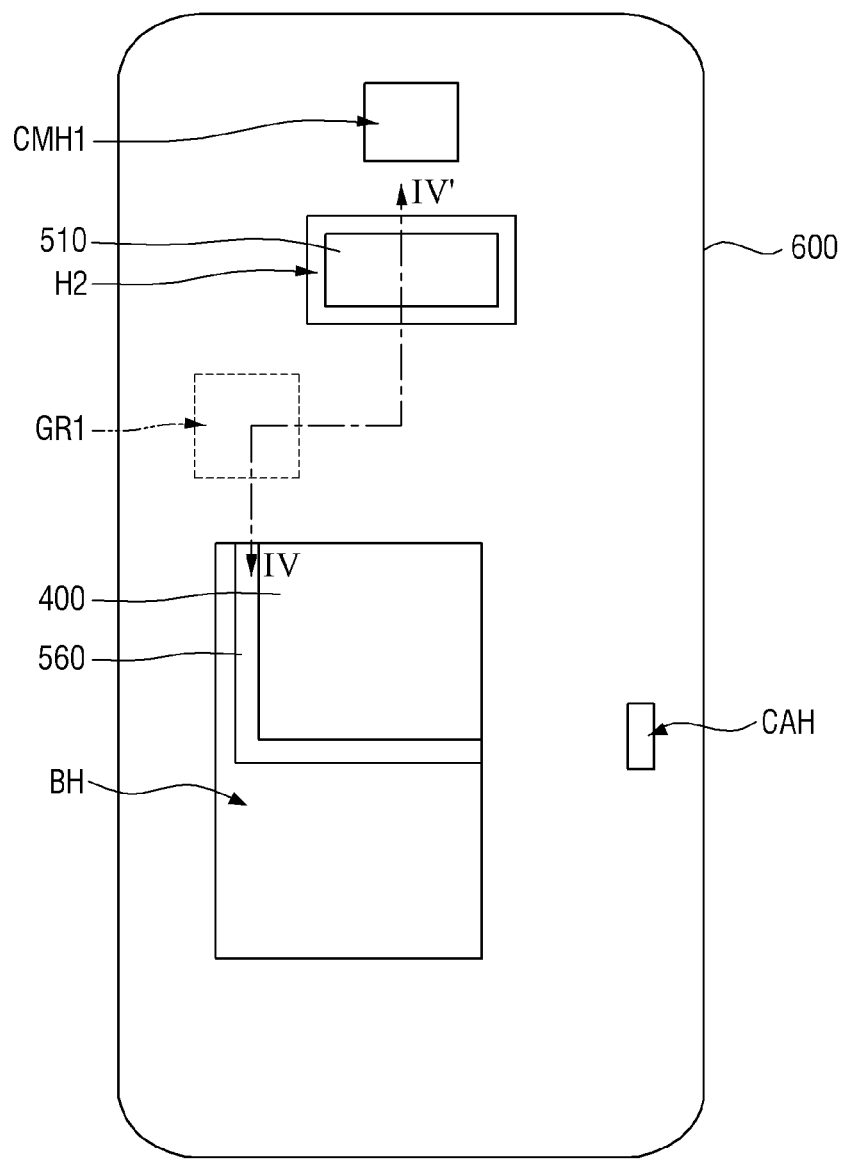
FIG. 16 is a bottom view of an example of a bracket attached to the bottom of a display panel according to an exemplary embodiment.
Figure 17:
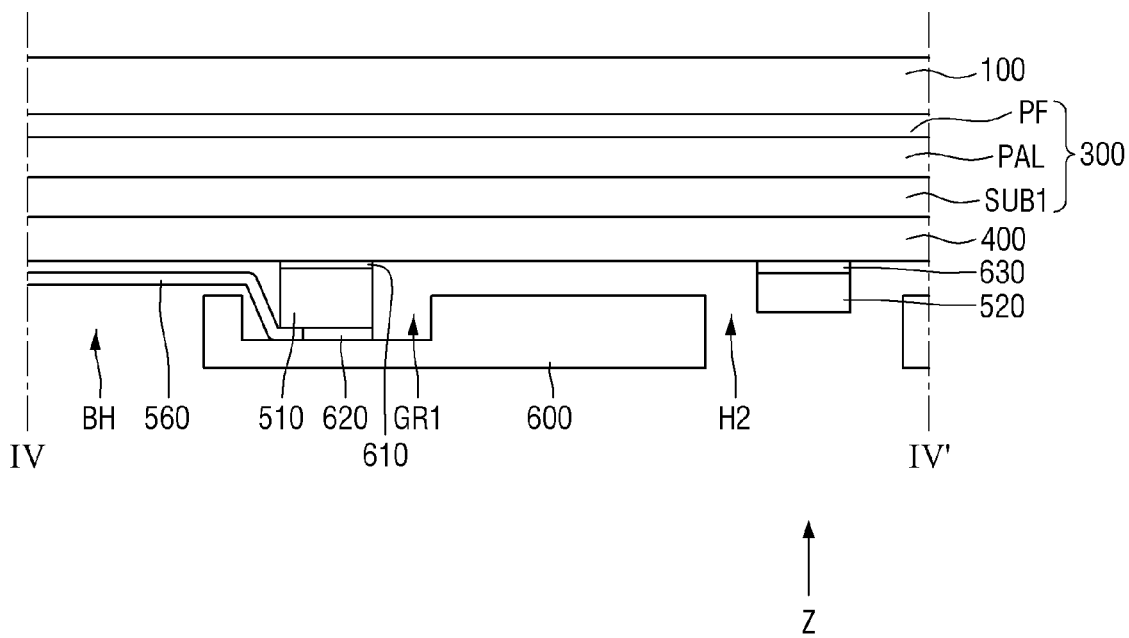
FIG. 17 is a cross-sectional view of an example of the bracket of FIG. 16 taken along line IV-IV' according to an exemplary embodiment.

FIG. 16 is a bottom view of an example of the bracket 600 attached to the bottom of the display panel 300 according to an exemplary embodiment. FIG. 17 is a cross-sectional view of the bracket 600 of FIG. 16 taken along line IV-IV' according to an exemplary embodiment.

The exemplary embodiment illustrated in FIGS. 16 and 17 is different from the exemplary embodiment illustrated in FIGS. 4 and 8 in that a second hole H2 is formed instead of the second groove GR2. When referring to FIGS. 16 and 17, for convenience of explanation, a redundant description of elements and features previously described with reference to FIGS. 4 and 8 will be omitted.

Referring to FIGS. 16 and 17, the second hole H2 may be a hole passing through a bracket 600. Since the second hole H2 serves as a sound box of the second vibrating device 520, the position of the second hole H2 may be changed according to the position of the second vibrating device 520. When the second hole H2, instead of the second groove GR2, is disposed to overlap the second vibrating device 520 in the third direction (Z-axis direction), the space of a sound box of a second sound output by vibrating the display panel 300 using the second vibrating device 520 may be increased, thereby further increasing the SPL of the second sound.

Figure 18:
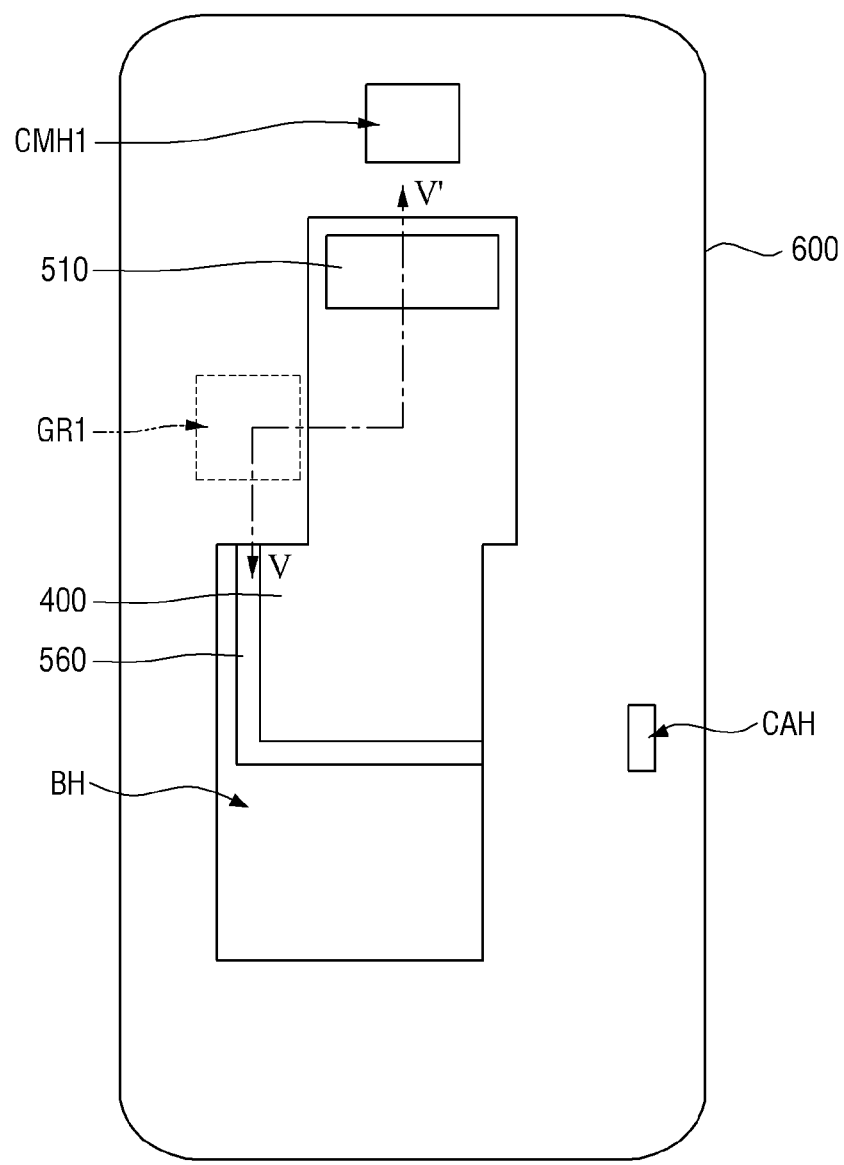
FIG. 18 is a bottom view of an example of a bracket attached to the bottom of a display panel according to an exemplary embodiment.
Figure 19:
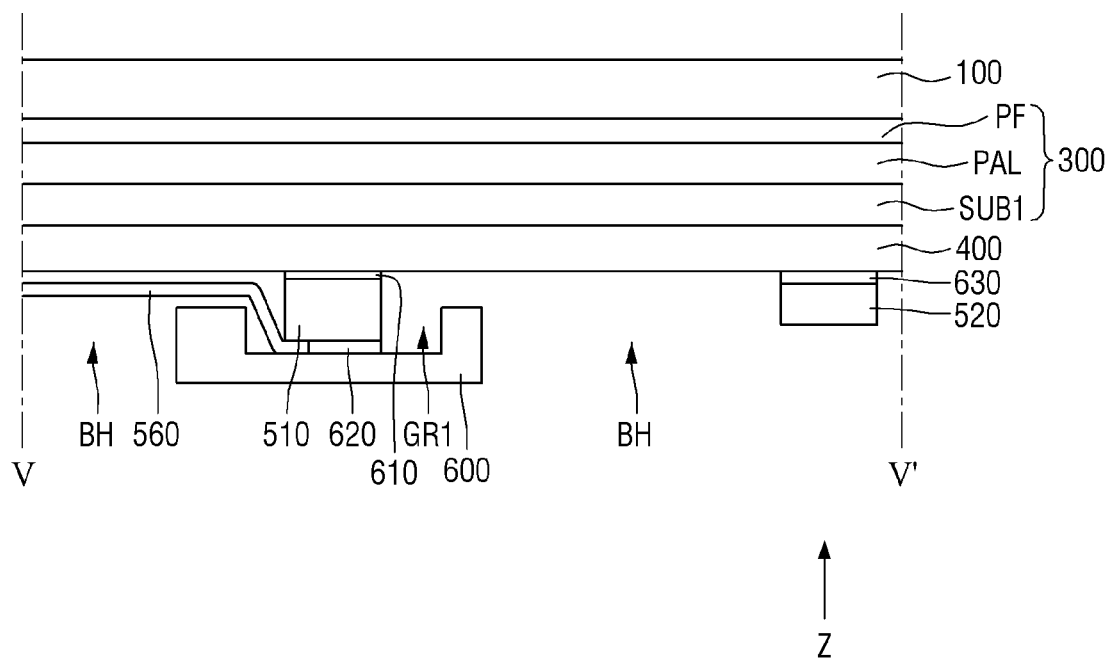
FIG. 19 is a cross-sectional view of the bracket of FIG. 18 taken along line V-V' according to an exemplary embodiment.

FIG. 18 is a bottom view of an example of the bracket 600 attached to the bottom of the display panel 300 according to an exemplary embodiment. FIG. 19 is a cross-sectional view of the bracket of FIG. 18 taken along line V-V' according to an exemplary embodiment.

The exemplary embodiment illustrated in FIGS. 18 and 19 is different from the exemplary embodiment illustrated in FIGS. 4 and 8 in that the second groove GR2 is omitted and a battery hole BH is disposed to overlap the first vibrating device 510. When referring to FIGS. 18 and 19, for convenience of explanation, a redundant description of elements and features previously described with reference to FIGS. 4 and 8 will be omitted.

Referring to FIGS. 18 and 19, the battery hole BH is a hole passing through a bracket 600 and may be disposed to overlap the battery 790 and the second vibrating device 520 in the third direction (Z-axis direction). In this case, the space of a sound box of a second sound output by vibrating the display panel 300 using the second vibrating device 520 may be increased, thereby further increasing the SPL of the second sound.

A length of the battery 790 in the first direction (X-axis direction) may be greater than a length of the second vibrating device 520 in the first direction (X-axis direction). Therefore, a length of the battery hole BH in the first direction (X-axis direction) in an area overlapping the battery 790 may be greater than a length of the battery hole BH in the first direction (X-axis direction) in an area overlapping the second vibrating device 520.

In an exemplary embodiment, the battery hole BH does not overlap a first groove GR1. However, exemplary embodiments are not limited to this case. In an exemplary embodiment in which the battery hole BH overlaps the second vibrating device 520, the first groove GR1 may be omitted. In this case, the second surface of the first vibrating device 510 may be attached to a separate support member as illustrated in FIGS. 20 through 23, and the separate support member may be attached to the bracket 600.

Figure 20:
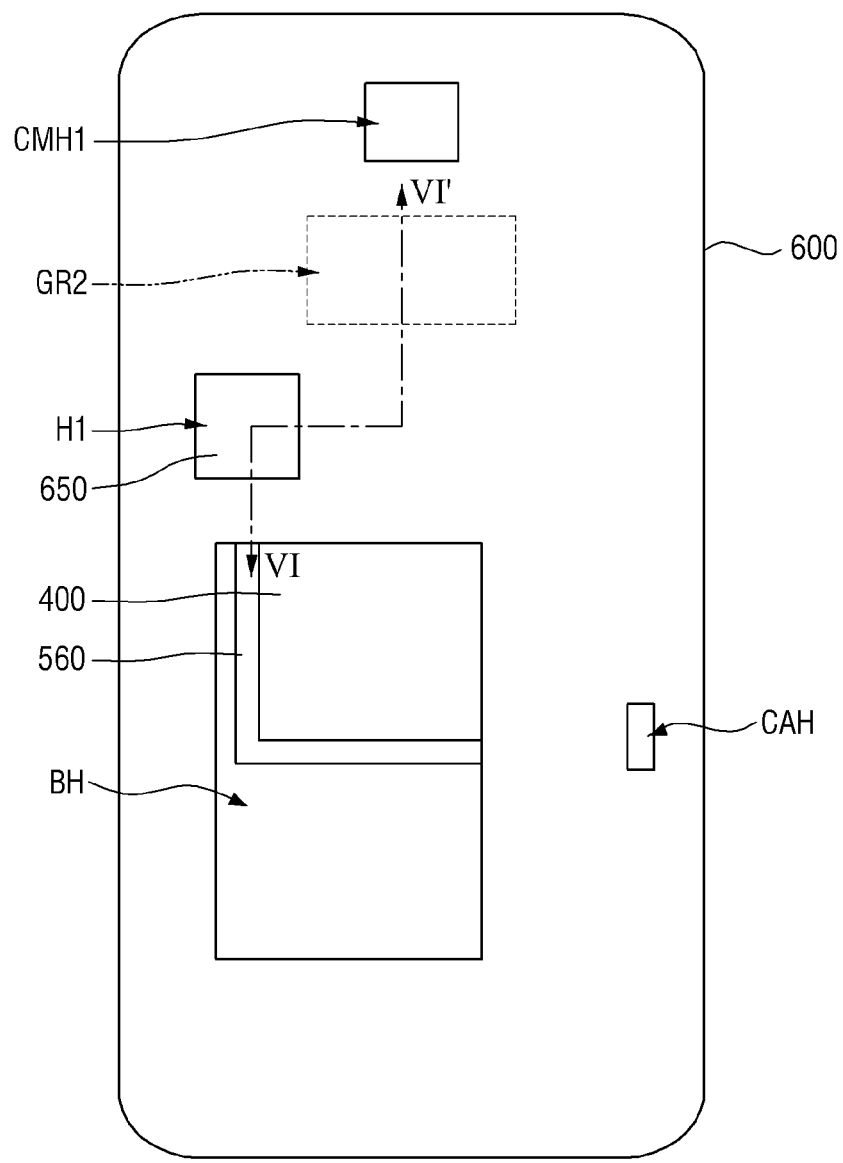
FIG. 20 is a bottom view of an example of a bracket attached to the bottom of a display panel according to an exemplary embodiment.
Figure 21:
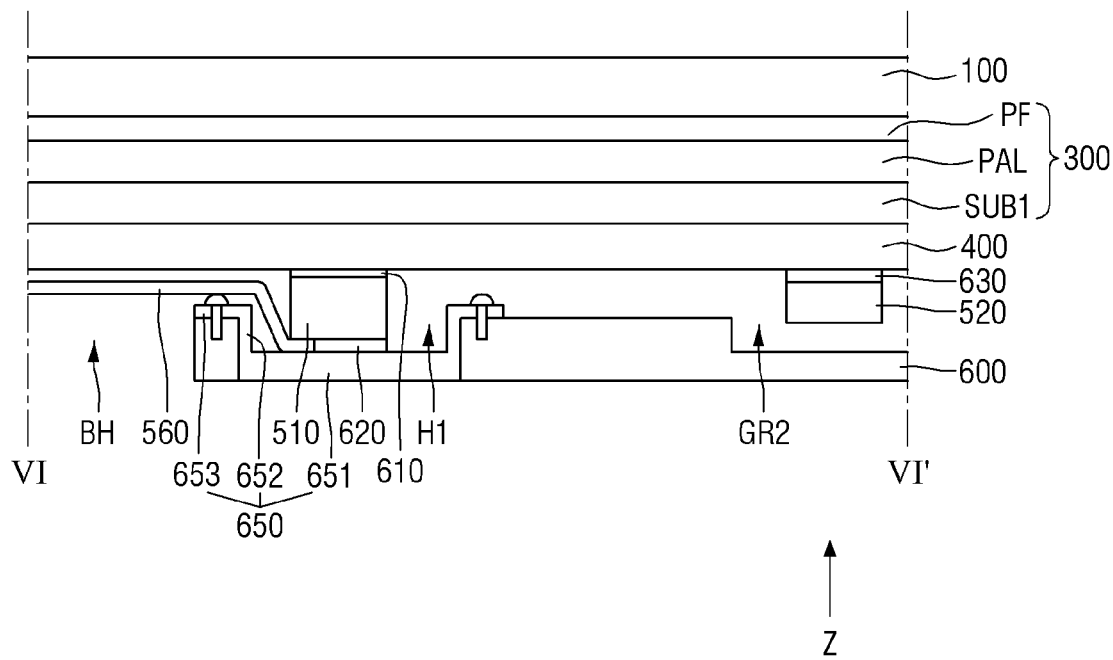
FIG. 21 is a cross-sectional view of the bracket of FIG. 20 taken along line VI-VI' according to an exemplary embodiment.
Figure 22:
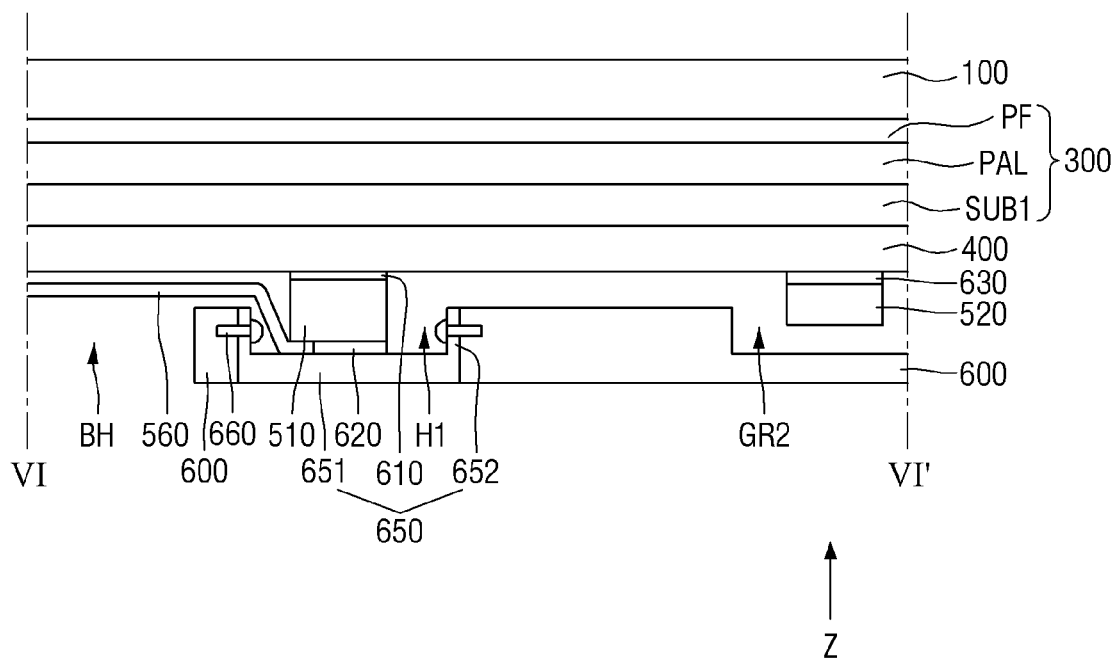
FIG. 22 is a cross-sectional view of the bracket of FIG. 20 taken along line VI-VI' according to an exemplary embodiment.

FIG. 20 is a bottom view of an example of the bracket 600 attached to the bottom of the display panel 300 according to an exemplary embodiment. FIG. 21 is a cross-sectional view of the bracket 600 of FIG. 20 taken along line VI-VI' according to an exemplary embodiment. FIG. 22 is a cross-sectional view of the bracket 600 of FIG. 20 taken along line VI-VI' according to an exemplary embodiment.

The exemplary embodiment illustrated in FIGS. 20 through 22 is different from the exemplary embodiment illustrated in FIGS. 4 and 8 in that a first hole H1 is formed instead of the first groove GR1. When referring to FIGS. 20 through 22, for convenience of explanation, a redundant description of elements and features previously described with reference to FIGS. 4 and 8 will be omitted.

Referring to FIGS. 20 through 22, in an exemplary embodiment, a separate support member 650 for fixing the first vibrating device 510 to a bracket 600 is utilized. The second surface of the first vibrating device 510 may be attached to the support member 650 by a second adhesive 620. The support member 650 may be fixed to a surface of the bracket 600 by fixing members 660. For example, the support member 650 may be fixed to the upper surface of the bracket 600 facing the display panel 300 by fixing members 660 extending through the upper surface of the bracket 600 (see FIG. 21), or the support member 650 may be fixed to side surfaces of the bracket 600, which are adjacent to the upper surface of the bracket 600 facing the display panel 300, by fixing members 660 extending through the side surfaces of the bracket 600 (see FIG. 22). Therefore, the first vibrating device 510 may provide haptic feedback by vibrating the bracket 600. The support member 650 may include, for example, plastic, metal, or both plastic and metal. The support member 650 may be made of the same material as the bracket 600.

Referring to FIG. 21, the support member 650 may include a bottom portion 651, sidewalls 652, and fixing portions 653. In FIG. 21, the support member 650 includes a plurality of sidewalls 652 and a plurality of fixing portions 653. However, exemplary embodiments are not limited thereto. For example, in an exemplary embodiment, the support member 650 may include only one sidewall 562 and only one fixing portion 653.

The bottom portion 651 may be formed flat in the first direction (X-axis direction) and the second direction (Y-axis direction), and the second adhesive 620 may be attached to an upper surface of the bottom portion 651. A length of the bottom portion 651 in the third direction (Z-axis direction) may be smaller than a length of the bracket 600 in the third direction (Z-axis direction). A shape of the bottom portion 651 may be, but is not limited to, a quadrilateral in a plan view.

The sidewalls 652 may extend from edges of the bottom portion 651 and extend parallel to sidewalls of the first hole H1. The sidewalls 652 may extend from at least one side of the bottom portion 651.

Referring to the first groove GR1 illustrated in FIGS. 4 and 8, in an exemplary embodiment, the first groove GR1 does not extend entirely through the bracket 600. For example, the first groove GR1 may be formed in the upper surface of the bracket 600 and may penetrate toward the lower surface of the bracket 600 without extending through the lower surface of the bracket 600. In contrast, referring to the first hole H1 illustrated in FIGS. 20 through 22, the first hole H1 may extend entirely through the bracket 600. For example, the first hole H1 may be a through hole that extends through both the upper and lower surfaces of the bracket 600. At least a portion of the support member 650 may be disposed within the first hole H1. For example, the bottom portion 651 and at least a portion of the sidewalls 652 of the support member 650 may be disposed within the first hole H1.

The fixing portions 653 may extend from upper edges of the sidewalls 652 and may be disposed on the first surface of the bracket 600. The fixing portions 653 may include fixing holes into which the fixing members 660 are inserted, and the bracket 600 may include fixing grooves overlapping the fixing holes of the fixing portions 653. The fixing members 660 may be inserted into the fixing holes of the fixing portions 653 and the fixing grooves of the bracket 600 in the third direction (Z-axis direction), thereby fixing the fixing portions 653 to the bracket 600. The fixing members 660 may be screws, the fixing holes of the fixing portions 653 may be screw holes, and the fixing grooves of the bracket 600 may be screw grooves. The fixing members 660 may also be referred to as fasteners. A fastener refers to any component configured to physically fasten one component to another component such as, for example, a screw, a bolt, a pin, etc.

In FIG. 21, the bracket 600 may include ring-shaped or hook-shaped protrusions protruding from the first surface of the bracket 600, and the fixing portions 653 of the support member 650 may include, instead of the fixing holes, insertion portions into which the protrusions of the bracket 600 are inserted. In this case, the support member 650 can be fixed to the bracket 600 without the fixing members 660.

As shown in FIG. 21, at least a portion of the support member 650 may be disposed opposite to at least one side surface of the first vibrating device 510. For example, the sidewalls 652 of the support member 650 may respectively be disposed opposite to the side surfaces of the first vibrating device 510 that extend from the upper surface of the first vibrating device 510 to the lower surface of the first vibrating device 510.

Referring to FIG. 22, in an exemplary embodiment, the support member 650 does not include the fixing portions 653 and may include a bottom portion 651 and sidewalls 652.

The sidewalls 652 may include holes into which the fixing members 660 are inserted, and the bracket 600 may include fixing holes overlapping the holes of the sidewalls 652. The fixing members 660 may be inserted into the holes of the sidewalls 652 and the fixing grooves of the bracket 600 in a direction intersecting the third direction (Z-axis direction). Therefore, the sidewalls 652 may be fixed to the bracket 600. The fixing members 660 may be screws, the fixing holes of the sidewalls 652 may be screw holes, and the fixing grooves of the bracket 600 may be screw grooves.

To widen the space of a sound box of a second sound output by vibrating the display panel 300 using the second vibrating device 520, a second groove GR2 illustrated in FIG. 20 may be replaced with the second hole H2, as illustrated in FIGS. 16 and 17. Alternatively, the second groove GR2 illustrated in FIG. 20 may be omitted, as illustrated in FIGS. 18 and 19, and a battery hole BH may be extended up to the area of the second groove GR2.

As shown in FIG. 22, at least a portion of the support member 650 may be disposed opposite to at least one side surface of the first vibrating device 510. For example, the sidewalls 652 of the support member 650 may respectively be disposed opposite to the side surfaces of the first vibrating device 510 that extend from the upper surface of the first vibrating device 510 to the lower surface of the first vibrating device 510.

Figure 23:
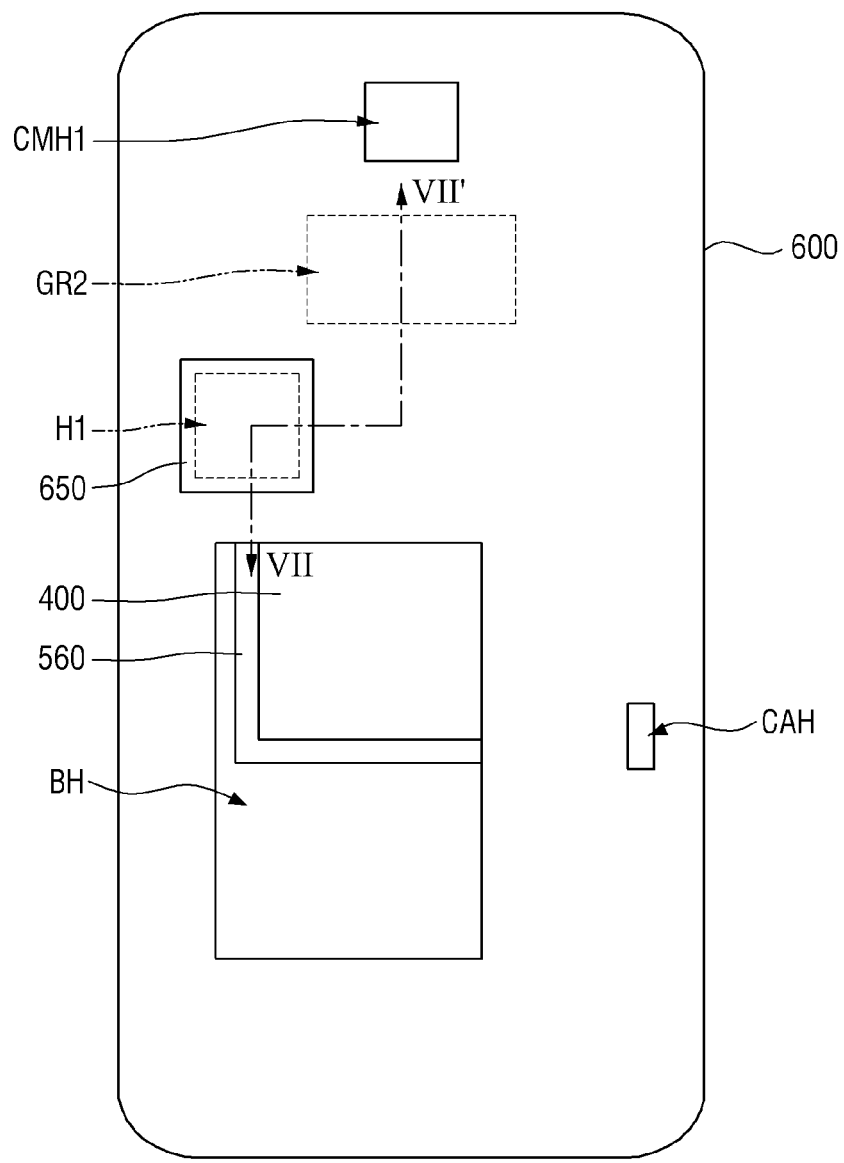
FIG. 23 is a bottom view of an example of a bracket attached to the bottom of a display panel according to an exemplary embodiment.
Figure 24:
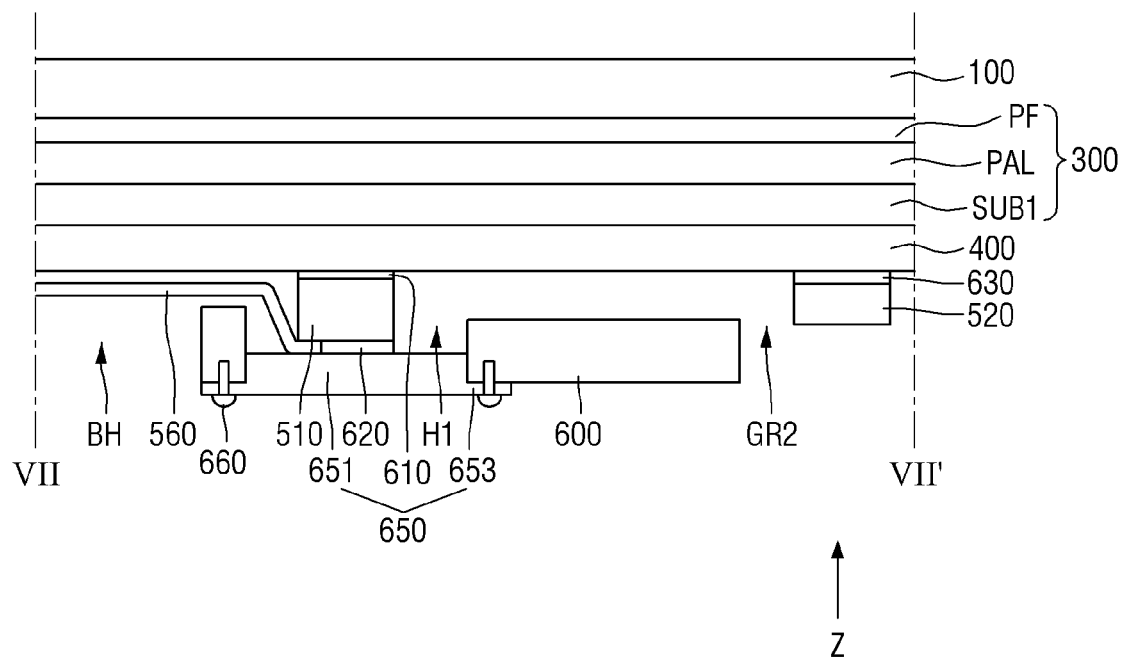
FIG. 24 is a cross-sectional view of the bracket of FIG. 23 taken along line VII-VII' according to an exemplary embodiment.

FIG. 23 is a bottom view of an example of the bracket 600 attached to the bottom of the display panel 300 according to an exemplary embodiment. FIG. 24 is a cross-sectional view of the bracket 600 of FIG. 23 taken along line VII-VII' according to an exemplary embodiment.

The exemplary embodiment illustrated in FIGS. 23 and 24 is different from the exemplary embodiment illustrated in FIGS. 20 through 22 in that a support member 650 is formed to cover a first hole H1. When referring to FIGS. 23 and 24, for convenience of explanation, a redundant description of elements and features previously described with reference to FIGS. 20 through 22 will be omitted.

Referring to FIGS. 23 and 24, the support member 650 may protrude from the first hole H1 in the third direction (Z-axis direction) with respect to a second surface of a bracket 600. The support member 650 may be fixed to the second surface of the bracket 600 by fixing members 660. Therefore, the first vibrating device 510 may provide haptic feedback by vibrating the bracket 600.

As illustrated in FIG. 24, the support member 650 may include a bottom portion 651 and fixing portions 653. Although the support member 650 includes a plurality of fixing portions 653 in FIG. 24, exemplary embodiments are not limited thereto. For example, in an exemplary embodiment, the support member 650 may include only one fixing portion 653.

The bottom portion 651 may be formed flat in the first direction (X-axis direction) and the second direction (Y-axis direction), and a second adhesive 620 may be attached to an upper surface of the bottom portion 651. A length of the bottom portion 651 in the third direction (Z-axis direction) may be smaller than a length of the bracket 600 in the third direction (Z-axis direction). A shape of the bottom portion 651 may be, but is not limited to, a quadrilateral in a plan view.

The fixing portions 653 may extend from edges of the bottom portion 651 and may be disposed on the second surface of the bracket 600. A length of the bottom portion 651 in the third direction (Z-axis direction) may be greater than a length of the fixing portions 653 in the third direction (Z-axis direction). However, exemplary embodiments are not limited to this case. The length of the bottom portion 651 in the third direction (Z-axis direction) may also be substantially the same as the length of the fixing portions 653 in the third direction (Z-axis direction). The fixing members 660 may be inserted into fixing holes of the fixing portions 653 and fixing grooves of the bracket 600 in the third direction (Z-axis direction), thereby fixing the fixing portions 653 to the bracket 600. The fixing members 660 may be screws, the fixing holes of the fixing portions 653 may be screw holes, and the fixing grooves of the bracket 600 may be screw grooves.

To widen the space of a sound box of a second sound output by vibrating the display panel 300 using the second vibrating device 520, a second groove GR2 illustrated in FIG. 23 may be replaced with the second hole H2 as illustrated in FIGS. 16 and 17. Alternatively, the second groove GR2 illustrated in FIG. 23 may be omitted as illustrated in FIGS. 18 and 19, and a battery hole BH may be extended up to the area of the second groove GR2.

Figure 25:
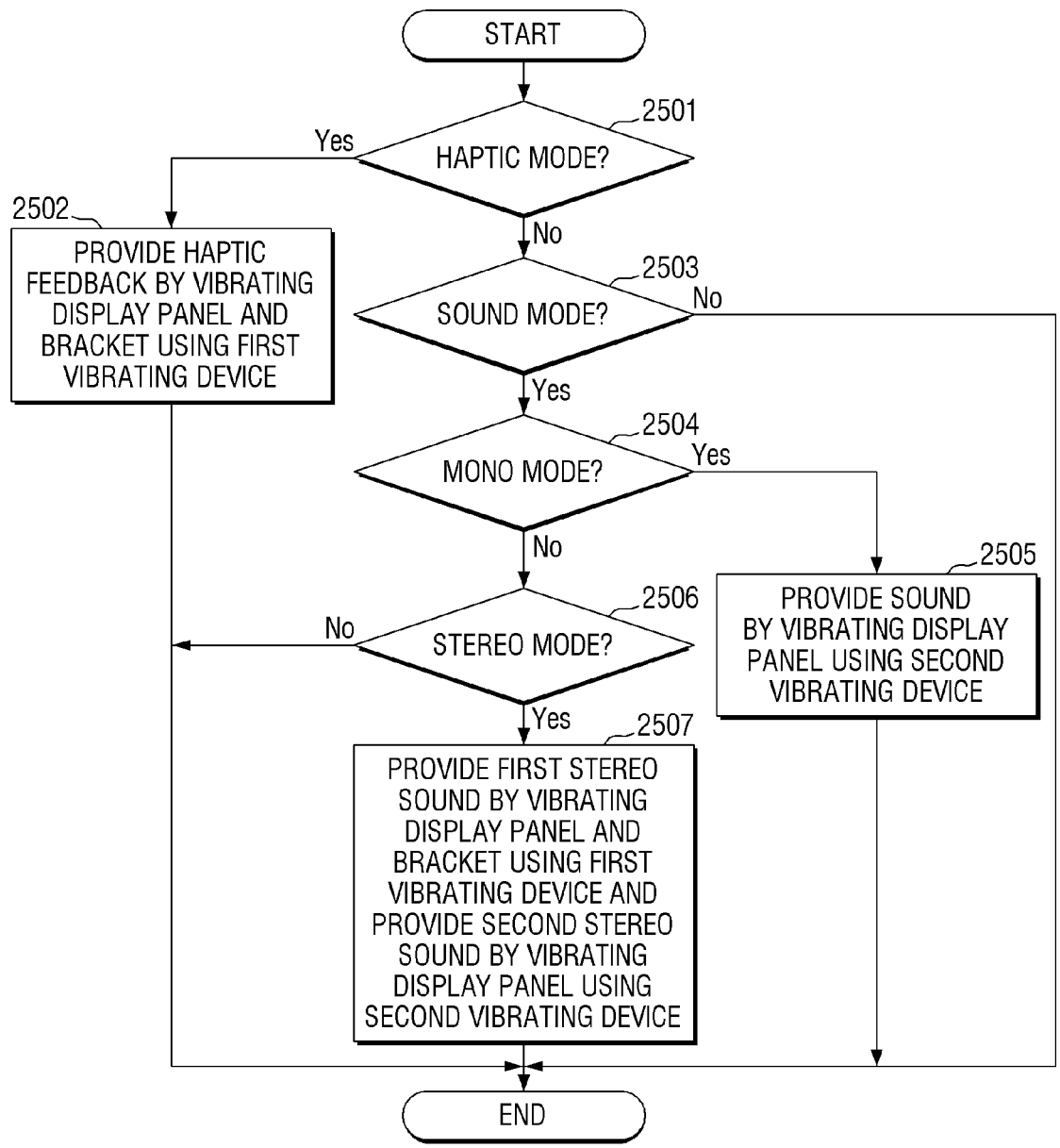
FIG. 25 is a flowchart illustrating a method of implementing a sound mode and a haptic mode of a display device according to an exemplary embodiment.

FIG. 25 is a flowchart illustrating a method of implementing a sound mode and a haptic mode of a display device according to an exemplary embodiment.

Referring to FIG. 25, it is determined whether the display device is operating in a haptic mode (operation 2501). If it is determined in operation 2501 that the display device is operating in the haptic mode (Yes), the display device provides haptic feedback by vibrating the display panel 300 and the bracket 600 using the first vibrating device 510 (operation 2502). Otherwise, if it is determined in operation 2501 that the display device is not operating in the haptic mode (No), the method proceeds to operation 2503.

In operation 2503, it is determined whether the display device is operating in a sound mode. If it is determined in operation 2503 that the display device is not operating in the sound mode (No), the method ends. Otherwise, if it is determined in operation 2503 that the display device is operating in the sound mode (Yes), the method proceeds to operation 2504.

In operation 2504, it is determined whether the display device is operating in a mono mode. If it is determined in operation 2504 that the display device is operating in the mono mode (Yes), the method proceeds to operation 2505. Otherwise, if it is determined in operation 2504 that the display device is not operating in the mono mode (No), the method proceeds to operation 2506.

In operation 2505, the display device provides sound by vibrating the display panel 300 using the second vibrating device 520.

In operation 2506, it is determined whether the display device is operating in a stereo mode. If it is determined in operation 2506 that the display device is operating in the stereo mode (Yes), the method proceeds to operation 2507. Otherwise, if it is determined in operation 2506 that the display device is not operating in the stereo mode (No), the method proceeds to operation 2502.

In operation 2507, the display device provides first stereo sound by vibrating the display panel 300 and the bracket 600 using the first vibrating device 510, and provides second stereo sound by vibrating the display panel 300 using the second vibrating device 520.

FIGS. 26 and 27 illustrate sound output according to three-dimensional (3D) coordinates of a display device according to an exemplary embodiment in a call mode.

For example, as shown in FIGS. 26 and 27, in an exemplary embodiment, when in a call mode, sound may be output using the second vibrating device 520, since the second vibrating device 520 is closer to the user's ear than the first vibrating device 510 is when in the call mode. FIGS. 26 and 27 illustrate the display device being tilted, for example, as a result of the user moving and holding the display device up to his or her ear. According to exemplary embodiments, the display device may detect this tilting action using, for example, a gyroscope, an accelerometer, etc., and sound being output by the display device may switch between being output by the first vibrating device 510 and the second vibrating device 520 depending on the detected position of the display device.

FIG. 28 is a bottom view of an example of the display panel 300 of FIG. 2 attached to the cover window 100 of FIG. 2 according to an exemplary embodiment. The elements illustrated in FIG. 28 have been previously described. Accordingly, for convenience of explanation, a redundant description of these elements is omitted. While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
 a display panel that displays an image;
 a bracket disposed on a first surface of the display panel;
 a first vibrating device having a first surface and a second surface; and
 a second vibrating device having a first surface and a second surface,
 wherein the first surface of the first vibrating device is attached to the first surface of the display panel, and the second surface of the first vibrating device is attached to a first surface of the bracket which faces the first surface of the display panel,
 wherein the first vibrating device is configured to generate a first sound by vibrating the display panel according to first vibration data in a sound mode and provide a haptic feedback by vibrating the bracket according to second vibration data in a haptic mode,
 wherein the first surface of the second vibrating device is attached to the first surface of the display panel, and
 wherein any other component is not disposed between the second surface of the second vibrating device and the first surface of the bracket.

2. The display device of claim 1, further comprising:
 a first adhesive disposed between the display panel and the first vibrating device and attaching the first surface of the first vibrating device to the first surface of the display panel; and
 a second adhesive disposed between the bracket and the first vibrating device and attaching the second surface of the first vibrating device to the first surface of the bracket.

3. A display device, comprising:
 a display panel that displays an image;
 a bracket disposed on a first surface of the display panel; and
 a first vibrating device disposed between the first surface of the display panel and a first surface of the bracket which faces the first surface of the display panel,
 wherein the first vibrating device is configured to output a first sound and provide a haptic feedback by vibrating the display panel and the bracket,
 wherein the bracket comprises a first groove disposed in the first surface of the bracket and overlapping the first vibrating device,
 wherein the first groove comprises an empty space cut into the first surface of the bracket and is defined by a bottom surface of the bracket and a side surface of the bracket extending upward from the bottom surface of the bracket, the first vibrating device is attached to the bottom surface of the bracket, a portion of the empty space cut into the first surface of the bracket is disposed between the first vibrating device and the side surface of the bracket, and the first vibrating device is disposed between the bottom surface of the bracket and the first surface of the display panel.

4. The display device of claim 3, wherein a first surface of the first vibrating device is attached to the first surface of the display panel, and a second surface of the first vibrating device is attached to the bottom surface of the first groove.

5. The display device of claim 4, further comprising:
 a first adhesive disposed between the display panel and the first vibrating device and attaching the first vibrating device to the display panel; and
 a second adhesive disposed between the bottom surface of the first groove and the first vibrating device and attaching the first vibrating device to the bottom surface of the first groove.

6. The display device of claim 1, wherein the bracket comprises a first hole overlapping the first vibrating device.

7. The display device of claim 6, further comprising:
 a support member disposed on the second surface of the first vibrating device and supporting the first vibrating device.

8. The display device of claim 7, wherein the support member overlaps the first hole.

9. The display device of claim 7, further comprising:
 a fastener attaching the support member to a second surface of the bracket, which is opposite the first surface of the bracket.

10. The display device of claim 7, wherein at least a portion of the support member is disposed opposite to at least one side surface of the first vibrating device.

11. The display device of claim 10, further comprising:
 a fastener attaching the support member to a sidewall of the first hole of the bracket.

12. The display device of claim 7, wherein the support member is disposed on the first surface of the bracket.

13. The display device of claim 12, further comprising:
 a fastener attaching the support member to the first surface of the bracket.

14. A display device, comprising:
 a display panel that displays an image;
 a bracket disposed on a first surface of the display panel;
 a first vibrating device disposed on the first surface of the display panel, and disposed between the first surface of the display panel and a first surface of the bracket which faces the first surface of the display panel;
 a second vibrating device disposed on the first surface of the display panel,
 wherein the first vibrating device is configured to output a first sound by vibrating the display panel according to first vibration data in a sound mode and provide a haptic feedback by vibrating the bracket according to second vibration data in a haptic mode, and the second vibrating device is configured to output a second sound by vibrating the display panel according to third vibration data in the sound mode; and
 a gap disposed between the second vibrating device and the bracket,
 wherein the second vibrating device is not attached to the bracket, wherein a height of the first vibrating device is larger than a height of the second vibrating device, and wherein any other component is not disposed between the second surface of the second vibrating device and the first surface of the bracket.

15. The display device of claim 14, wherein a first surface of the first vibrating device is attached to the first surface of the display panel, and a second surface of the first vibrating device is attached to the first surface of the bracket.

16. The display device of claim 15, further comprising:

a first adhesive disposed between the display panel and the first vibrating device and attaching the first vibrating device to the display panel; and a second adhesive disposed between the bracket and the first vibrating device and attaching the first vibrating device to the bracket.

17. The display device of claim 14, further comprising:

an adhesive disposed between the display panel and the second vibrating device.

18. The display device of claim 14, wherein the bracket comprises a first groove disposed in the first surface of the bracket and overlapping the first vibrating device, and a second groove overlapping the second vibrating device.

19. The display device of claim 18, wherein the gap is disposed between a second surface of the second vibrating device and a bottom surface of the second groove, wherein a second surface of the first vibrating device is attached to a bottom surface of the first groove.

20. The display device of claim 14, wherein the bracket comprises a first groove disposed in the first surface of the bracket and overlapping the first vibrating device, and a second hole overlapping the second vibrating device.

21. The display device of claim 20, further comprising:

a battery disposed on a second surface of the bracket, which is opposite the first surface of the bracket, wherein the second hole overlaps the battery.

22. The display device of claim 14, wherein the bracket comprises a first hole in which the first vibrating device is disposed, and a second hole in which the second vibrating device is disposed.

23. The display device of claim 22, further comprising:

a support member disposed on a surface of the first vibrating device and supporting the first vibrating device.

24. The display device of claim 23, wherein the support member overlaps the first hole.

25. The display device of claim 14, wherein the first vibrating device is a linear resonant actuator (LRA) which vibrates the display panel and the bracket by generating a magnetic force using a voice coil according to a first applied voltage, and the second vibrating device is a piezoelectric element which vibrates the display panel using a piezoelectric material that contracts or expands according to a second applied voltage.

26. The display device of claim 25, wherein the first vibrating device comprises:

a voice coil having a first end to which a first driving voltage is applied and a second end to which a second driving voltage is applied;

a magnet having a first surface in which a voice coil groove for accommodating the voice coil is disposed;

an elastic body disposed on a second surface of the magnet which is opposite the first surface of the magnet; and a chassis disposed on the elastic body.

27. The display device of claim 25, wherein the second vibrating device comprises:

a first electrode to which a first driving voltage is applied;

a second electrode to which a second driving voltage is applied; and a vibration layer disposed between the first electrode and the second electrode and having a piezoelectric material which contracts or expands according to the first driving voltage applied to the first electrode and the second driving voltage applied to the second electrode.

* * * * *